United States Patent
Rempfer et al.

(10) Patent No.: US 7,532,140 B1
(45) Date of Patent: May 12, 2009

(54) GRADIENT INSENSITIVE SPLIT-CORE DIGITAL TO ANALOG CONVERTER

(75) Inventors: William C Rempfer, Los Altos, CA (US); Hassan Malik, Milpitas, CA (US); James L Brubaker, Milpitas, CA (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 11/487,143

(22) Filed: Jul. 13, 2006

Related U.S. Application Data

(63) Continuation of application No. 11/284,619, filed on Nov. 21, 2005, now abandoned, which is a continuation of application No. 11/101,944, filed on Apr. 8, 2005, now abandoned, which is a continuation of application No. 10/440,080, filed on May 15, 2003, now Pat. No. 6,937,178.

(51) Int. Cl.
  *H03M 1/68* (2006.01)
(52) U.S. Cl. ........................... 341/145; 341/154
(58) Field of Classification Search ............... 341/144, 341/153, 154, 145
See application file for complete search history.

(56) References Cited

U.S. PATENT DOCUMENTS

| | | | |
|---|---|---|---|
| 3,495,235 A | 2/1970 | Ottesen | |
| 4,126,853 A | 11/1978 | Frerking | |
| 4,146,882 A | 3/1979 | Hoff, Jr. et al. | |
| 4,544,912 A | 10/1985 | Iwamoto et al. | |
| 4,623,983 A | 11/1986 | Meguerdichian | |
| 4,782,323 A * | 11/1988 | Lucas | 341/150 |
| 4,808,998 A | 2/1989 | Yamada | |
| 4,851,842 A | 7/1989 | Iwamatsu | |
| 4,864,215 A * | 9/1989 | Schouwenaars et al. | 341/144 |
| 4,866,261 A | 9/1989 | Pace | |
| 4,873,525 A | 10/1989 | Iida | |

(Continued)

FOREIGN PATENT DOCUMENTS

EP 0625827 11/1994

(Continued)

OTHER PUBLICATIONS

"Look to the MDAC for Precision Control", Electronic Design, Penton Publishing, Cleveland, OH; USA, vol. 28, No. 19, Sep. 1980, p. 111-114; LC125019-125022.

Toute L, Electron-IQUE, Societe des Editions Radio, Paris.; FR, No. 506, Aug. 9, 1985, pp. 94-99; LC125000-125005.

Electronics, Monolithic d-a Converter Operates on Single Supply, New York, USA vol. 53, No. 5, Feb. 1980, pp. 125-131; York, USA vol. 53, No. 5, Feb. 1980, pp. 125-131; LC125105-125114.

(Continued)

*Primary Examiner*—Howard Williams
(74) *Attorney, Agent, or Firm*—McDermott Will & Emery LLP

(57) ABSTRACT

Digital to analog converter circuits and methods are provided for producing an analog output voltage indicative of a digital input signal with at least partial insensitivity to error gradients. Described are split-core resistive elements, which include a plurality of one-dimensional or multi-dimensional resistive strings, that may be used to reduce or substantially eliminate the effects that error gradients have on the linearity of the analog output voltages of a resistive string or interpolating amplifier DACs. The resistor strings that make up the split-core resistive elements are configured in such a manner that combining respective output voltages from each of the resistor strings results in an analog output voltage that is at least partially insensitive to the effects of error gradients.

20 Claims, 12 Drawing Sheets

U.S. PATENT DOCUMENTS

| | | | |
|---|---|---|---|
| 4,891,645 A | 1/1990 | Lewis et al. | |
| 4,910,515 A | 3/1990 | Iwamatsu | |
| 4,973,979 A | 11/1990 | Ikeda | |
| 4,978,959 A | 12/1990 | Chong et al. | |
| 4,990,916 A | 2/1991 | Wynne et al. | |
| 5,010,337 A | 4/1991 | Hisano et al. | |
| 5,119,095 A | 6/1992 | Asazawa | |
| 5,126,740 A | 6/1992 | Kawada | |
| 5,212,482 A | 5/1993 | Okuyama | |
| 5,270,715 A | 12/1993 | Kano | |
| 5,274,373 A * | 12/1993 | Kanoh | 341/144 |
| 5,278,558 A | 1/1994 | Roth | |
| 5,302,951 A | 4/1994 | Yamashita | |
| 5,343,199 A * | 8/1994 | Sugawa | 341/144 |
| 5,396,245 A | 3/1995 | Rempfer | |
| 5,422,643 A | 6/1995 | Chu et al. | |
| 2002/0080054 A1 * | 6/2002 | Harada et al. | 341/154 |

FOREIGN PATENT DOCUMENTS

| | | |
|---|---|---|
| JP | 56-141620 | 11/1981 |
| JP | 56-168428 | 12/1981 |
| JP | 57-104320 | 6/1982 |
| JP | 58-079331 | 5/1983 |
| JP | 60-263525 | 12/1985 |
| JP | 61-263325 | 11/1986 |
| JP | 02-258429 | 12/1990 |
| WO | WO9210034 | 6/1992 |

OTHER PUBLICATIONS

Dennis M. Monticello, "A Quad CMOS Single-Supply Op Amp with Rail-to-Rail Output Swing," IEEE Journal of Solid-State Circuits, vol. SC-21, No. 6, Dec. 1986; LC49494-49502.

James L. McCreary and Paul R. Gray, "All-Mos Charge Re-distribution Analog-to-Digital Conversion Techniques—Part I," IEEE Journal Of Solid-State Circuits, vol. SC-10 No. 6, Dec. 1975; LC038718-038726.

Gensuke Goto, et al., "An NMOS Operation Amplifier for an Output Buffer of Analog LSI's," IEEE Journal Of Solid-State Circuits, vol. SC-17, No. 5, Oct. 1982; LC038727-038730.

Prabir C. Maulik, Nicholas van Bavel, Keith S. Albright, "An Analog/Digital Interface for Cellular Telephony," IEEE Journal of Solid-State Circuits, vol. 30, No. 3, Mar. 1995; LC038731-038739.

Roubik Gregorian, "A Continuously Variable Slope Adaptive Delta Modulation Codec System," IEEE Journal Of Solid-State Circuits, vol. SC-18, No. 6, Dec. 1983; LC038740-038748.

Ira Miller, "A Custom Data Conversion Subsystem For Personal Computers," IEEE Journal Of Solid-State Circuits, vol. SC-20, Apr. 1985; LC038749-038755.

KH Hadidi, Vicent S. Tso, Gabor C. Ternes, "An 8-b 1.3- MHz Successive- Approximation A/D Converter," IEEE Journal Of Solid-State Circuits, vol. 25, No. 3, Jun. 1990; LC038756-038761.

Horst L. Fiedler, et al., "A 5-Bit Building Block for 20 MHz A/D Converters," IEEE Journal Of Solid-State Circuits, vol. SC-16, No. 3, Jun. 1981; LC038762-038766.

Hans-Ulrich Post and Karl Schoppe, "A 14 Bit Monotonic NMOS D/A Converter," IEEE Journal Of Solid-State Circuits, vol. SC-18, No. 3, Jun. 1983; LC038767-038771.

John Fernandes, et sl., "A 14-bit 10-μs Subranging A/D Converter with S/H," IEEE Journal Of Solid-State Circuits, vol. 23, No. 6, Dec. 1998; LC038772-038778.

Bahram Fotouhi and David A. Hodges, "High-Resolution A/D Conversion in MOS/LSI," IEEE Journal Of Solid-State Circuits, vol. SC-14, No. 6, Dec. 1979; LC038779-038785.

John W. Yang and Kenneth W. Martin, "High-Resolution Low-Power CMOS D/A Converter," IEEE Journal Of Solid-State Circuits, vol. 24, No. 5, Oct. 1989; LC038786-038789.

Thomas P. Redfern, Joseph J. Connolly, Jr., et al., "A Monolithic Charge-Balancing Successive Approximation A/D Technique," IEEE Journal Of Solid-State Circuits, vol. SC-14, No. 6, Dec. 1979; LC038790-038798.

Richard K. Hester, et al., "A Monolithic Data Acquisition Channel," IEEE Journal Of Solid-State Circuits, vol. SC-18, No. 1, Feb. 1983; LC038799-038807.

Matt Townsend and Marcian E. Hoff, Jr., "An NMOS Microprocessor for Analog Signal Processing," IEEE Journal Of Solid-State Circuits, vol. SC-15, No. 1, Feb. 1980; LC038808-038813.

Marcian E. Hoff, Jr., "An NMOS Telephone Codec for Transmission and Switching Applications," IEEE Journal Of Solid-State Circuits, vol. SC-14, No. 1, Feb. 1979; LC038814-038820.

James H. Atherton and H. Thomas Simmonds, "An Offset Reduction Technique for Use with CMOS Integrated Comparators and Amplifiers," IEEE Journal Of Solid-State Circuits, vol. 27, No. 8, Aug. 1992; LC038821-038828.

Hae-Seung Lee, et al., "A Self-Calibrating 15 Bit CMOS A/D Converter," IEEE Journal Of Solid-State Circuits, vol. SC-19, No. 6, Dec. 1984; LC038833-038839.

Jen-Yen Huang, "Resistor Termination in D/A and A/D Converters," IEEE Journal Of Solid-State Circuits, vol. SC-15, No.6, Dec. 1980; LC038829-038832.

Adib R. Hamade, "A Single Chip All-Mos 8-Bit A/D Converter," IEEE Journal Of Solid-State Circuits, vol. SC-13, No. 6, Dec. 1978; LC038840-038846.

Yoshiaki Kuraishi, et al., "A Single-Chip NMOS Analog Front-End LSI for Modems," IEEE Journal Of Solid-State Circuits, vol. SC-17, No. 6, Dec. 1982; LC038847-038852.

Paul R. Gray, et al., "A Single-Chip NMOS Dual Channel Filter for PCM Telephony Applications," IEEE Journal Of Solid-State Circuits, vol. SC-14, No. 6, Dec. 1979; LC038853-038863.

Yoshiaki Kuraishi, et al., "A Single-Chip 20-Channel Speech Spectrum Analyzer Using A Multiplexed Switched-Capacitor Filter Bank," IEEE Journal Of Solid-State Circuits, vol. SC-19, No. 6, Dec. 1984; LC038864-038870.

Kazuo Yamakido, et al., "A Subscriber Digital Signal Processor LSI for PCM Applications," IEEE Journal Of Solid-State Circuits, vol. 23, No. 3, Jun. 1988; LC038871-038877.

Marcel J. M. Pelgrom, "A 10-b 50-MHz CMOS D/A Converter with 75:$\Omega$ Buffer," IEEE Journal Of Solid-State Circuits, vol. 25, No. 6, Dec. 1990; LC038878-038883.

Toshihiko Hamasaki, et al., "A 3-V, 22-mW Multibit Current-Mode $\Sigma\Delta$ DAC with 100 dB Dynamic Range," IEEE Journal Of Solid-State Circuits, vol. 31, No. 12, Dec. 1996; LC038884-038890.

Andre Abrial, et al., "A 27-MHz Digital-to-Analog Video Processor," IEEE Journal Of Solid-State Circuits, vol. 23, No. 6, Dec. 1988; LC038891-038902.

Harro Bruggemann, "Ultra-fast Feedback A/D Conversion Made Possible by a Nonuniform Error Quantizer.," IEEE Journal Of Solid-State Circuits, vol_SC-18, No. 1, Feb. 1983; LC03890-038909.

Frederick G. Weiss, "A 1Gs/s 8-bit GaAs DAC with On-Chip Current Sources," XP002035880, IEEE, 1986. LC125015-125018.

National Semiconductor AN- 48 Applications for a New Ultra-High Speed Buffer; LC7268-7271.

IEEE International Electronic Manufacturing Technology Symposium, Sep. 15-17, 1986, San Francisco, Ca., USA, IEEE 1986, pp. 254-260; LC125006-125013.

National Semiconductor Corporation, "Linear 1-Databook National Semiconductor," 1 1982, see, e.g., pp. 8-28-8-59, 8-89-8-96, 8-133-8-150, National Semiconductor Corporation, Santa Clara, CA; LC009801-11761.

National Semiconductor Corporation, "Linear 1-Data Book National Semiconductor," 1980, see, e.g., pp. 8-10-8-44, 8-92-8-123. National Semiconductor Corporation, Santa Clara, CA; LC008363-9800.

National Semiconductor Corporation,"1984 Linear Supplement Databook National Semiconductor Corporation," 1984, see, e.g., pp. S5-12-S5-27, S5-36-S5-77, S-104-S5-136. National Semiconductor Corporation, Santa Clara, CA; LC007736-008362.

Burton, Phil, "CMOS DAC Application Guide," 3rd Edition, Analog Devices, Inc., 1984, see, e.g., pp. 13-22,27-35; AL003858-3894.

Analog—Digital Conversion Notes, 1977 Edited by Daniel Sheingold, see e.g., pp. 115-121, 143-149, 156-161; AL003895-4149.

Analog—Digital Conversion Handbook 3rd Edition Edited by Daniel Sheingold, see e.g. pp. 113-116, 122-124, 199-212, 224-235, 250, 490-494, 605-614, Analog Devices Inc., 1986; AL006092-6450.

Sony, "Data Book 1993 A/D, D/A Converters," Sony. 1993, see, e.g., pp. 117-155; LC006650-7095.

Micro Power Systems, "Micro Power Systems Inc. Data Conversion Products Data Book," 1992, see, e.g., pp. 3-205-3-208, 4-7-4-14,4-59-4-68,4-139-4-141,4-229-4-237,7-1-7-8,7-17-7-51, Micro Power Systems, Santa Clara, CA; LC005918-6649.

National Semiconductor Corporation, "Linear Applications Handbook National Semiconductor," 1978, Santa Clara, CA, see, e.g., pp. AN48-1-AN48-4; LC007096-7735.

ADI 1989/90 Conversion Products Databook; $LC^2$ MOS 12-Bit DACPORTS; AD 7245/AD 7248 2-221-2-234; AD7840, LC2 MOS 14-Bit DAC 2-329-2344 LC000782-813.

"DC Differential Voltmeter Resolves 1 Microvolt" james Williams electronics, Jul. 11, 1974 pp. 116-118, Cambridge, MA: LC002912-2914.

Williams, James "Simple techniques fine-tune sample hold performance," Electronic Design Nov. 12, 1981 pp. 5, 235-238; LC002915-2919.

Model 332A Voltage Calibrator #434 Jun. 1, 1966 John Fluke Mfg. Co., Inc.; LC002920-2921.

62-5018 Instruction manual for Model 8200 6 ½ Digit Voltage Current Calibrator Data Precision 1st Ed. Jan. 1981; LC002922-2961.

Weber, Jo "Oscilloscope Probe Circuits," Tektronix 1st Edition/First printing 062-1146-00 Nov. 1969; LC002962-2968.

John Fluke Manufacturing Company, Fluke—Instruction Manual—Model 332A Voltage Calibrator #434, 1966; LC002973-3049.

Tektronix—Oscilloscope Probe Circuits—Circuit Concept Series; LC003050-3169, 1969.

National Semiconductor, 3/84 National Semiconductor Application Note 344 : LF13006/LF13007 Precision Digital Gain Set Applications, National Semiconductor, 1995; LC003188-3193.

National Semiconductor, 9/81 National Semiconductor Application Note 271: Applying the New CMOS Micro-DACs, National Semiconductor, 1995; LC003604-3615.

National Semiconductor, 9/91 National Semiconductor Application Note 284: Single-Supply Application of CMOS Micro-DACs, National Semiconductor, 1995; LC003616-3619.

National Semiconductor, 3/86 National Semiconductor Application Note 293: Control Applications of CMOS Micro-DACs, National Semiconductor, 1995; LC003620-3625.

McGraw Hill, Inc./ Donald L. Schilling, Digital Integrated Electronics / McGraw Hill Books, 1977; LC003757-3828.

Michael M. Cirovic, 1977 Integrated Circuits / A User's Handbook, Reson Publishing Company, Inc., 1977; LC003829-3854.

Robert Mauro, 1989 Article: Engineering Electronics, Prentice Hall, 1989; LC003855-3875.

Analog Devices, "+5 Volt, Parallel Input Complete 12- Bit DAC," Analog Devices: DAC-8562; LC003876-3891.

Analog Devices, ≡Volt, Serial Input Complete 12-Bit DAC, Analog Devices: DAC-8512; LC003892-3911 No Date Available.

Daniel H. Sheingold, 1980 Transfer Interfacing Handbook, Analog Devices; LC004842-4847.

James Williams, Jul. 7, 1974 Electronics: Engineer's Notebook; LC004848-4850.

John Fluke Manufacturing Company, AC/DC Differential Voltmeter, 1966; LC004851-4858.

James Williams & Nicholas Catsimpoolas, "A Highly Regulated, Recording Constant Power, Voltage, and Current Supply for Electrophoresis and Isoelectric Focusing," Academic Press, 1976; LC004859-4861.

Jim Williams, "Designer's Guide To Temperature Measurement"; LC004862-4868, May 1975.

Julie Research Laboratories, Inc., 1970 Laboratory Manual for D.C. Measurement, 1970; LC004869-4871.

Bulletin: JRL Precision vol. 7 No. 3 LC004872-4877.

Bulletin H-3: Julie Research Laboratories (JRL) LC004878-4881.

Tektronix, Inc. Instruction Manual: Type W Plug-in Unit LC004882-4890.

National Semiconductors, 8/81 National Semiconductor Application Note 269, 1981; LC004891-4892.

Willard L. Erickson and Chester V. Wells, 1968 Paper: Experimental Backgrounds for Electronic Instrumentation, Laboratory Systems Research Inc., 1968; LC004893-4908.

Analog Devices, 1989-90 Data Conversion Products Databook, Analog Devices, 1989; LC004909-4957.

1978 Paper: IC Schematic Sourcemaster, John Wiley & Sons, Inc.; LC004958-4979.

"Maxim *MAX512/MAX513* (Low-Cost, Triple, 8-Bit Voltage-Output DACs with Serial Interface)," Rev. 2, Apr. 1994; AL000204-AL000219.

1976 ADI "Nonlinear Circuits Handbook"; LC013308-13838.

1980 ADI "Transducer Interfacing Handbook"; LC016540-16798.

Analog—Digital Conversion Handbook, 1972 Edited by Daniel Sheingold; LC012653-13050.

CMOS DAC Applications Guide 2nd Edition, 1984 by Phil Burton; AL003820-3857.

CMOS DAC Applications Guide 3rd Edition, 1984 by Phil Burton; AL003858-3894.

CMOS 16-Bit Multiplying DAC; AL004150-4157.

"World's First Monolithic 16-Bit D/A Converter" by Mike Tuthill and John Wynne Analog Dialogue 16-1, 1982; AL004158.

Aug. 14, 1981 ADI New Release "Technical Details on the AD7546, the industry's first monolithic 16-Bit DAC"; AL004159-4160.

Jun. 11, 1981 Electronic Design "Voltage-output monolithic DAC resolves 16 Bits" by Mike Tuthill and John Wynne; AL004161-4168.

Application Guide to CMOS Multiplying D/A Converters, 1978 Edited by Daniel Sheingold; AL004169-4216.

16-Bit Monotonic Voltage Output D/A Converter AD569; AL004217-4228.

DACPORT 16-Bit DAC is 16-Bit Monotonic—All Grades & Temp Ranges Analog Dialogue 20-2, 1986; AL004229.

DACPORT Low Cost Complete MP-Compatible 8-Bit DAC; AL004230-4237.

"Putting the AD558 DACPORT on the Bus" Doug Grant Analog Dialogue 14-2, 1980; AL004238-4239.

Application Note "Interfacing the AD558 DACPORT to Microprocessors", Doug Grant, Aug. 1980; AL004240-4245.

Application Note, "An Analysis of the Price and Performance of the AD558", Gooloe Suttler; AL004246-4249.

1979 Data Acquisition Products Catalog Supplement; AL004277-4616.

1992 Data Converter Reference Manual vol. 1; AL004617-5411.

1992 Amplifier Applications Guide, see e.g., IV 1-34; LC014903-15604.

1982 Data Acquisition Databook 1982 Integrated Circuits; AL006451-7500.

1980 Data Acquisition Components and Subsystems; AL007501-8384.

1978 Data Acquisition Products Catalog; AL008385-9011.

1988 Data Conversion Products Databook; AL09012-10259.

1986 Data Acquisition Databook Update and Selection Guide; AL010260-10594.

1982—1938 Data Acquisition Databook Update and Selection Guide; AL010868-11011.

1991 ADI "Mixed-Signal Design Seminar"; LC016799-17209.

1984 Data Acquisition Databook, vol. I—Integrated Circuits; AL011012-11518.

National Semiconductor, "Data Acquisition Databook", 1993 Edition, LC003912-LC004077.

Paul R. Gray et al., "MOS Operational Amplifier Design—A Tutorial Overview", IEEE Journal of Solid-State Circuits, vol. SC-17, No. 6, Dec. 1982, LC172361-LC172374.

Linear Technology, "12-Bit Rail-to-Rail Micropower DACs in SO-8", LTC1451, LTC1452/LTC1453, pp. 1-12.

Linear Technology, "Complete Single Supply 12-Bit Voltage Output DAC in SO-8", LTC1257, pp. 1-12.

Walt Kester, "Analog-Digital Conversion", Analog Devices, Inc. 2004, p. 3.10.

* cited by examiner

GRADIENT INSENSITIVE SPLIT-CORE DIGITAL TO ANALOG CONVERTER

BACKGROUND OF THE INVENTION

The present invention relates to digital to analog converters (DACs). More particularly, this invention relates to circuits and methods for providing a split-core DAC that is at least partially insensitive to the effects of error gradients.

The general purpose of a DAC is to transform digital input signals into analog output voltages. In other words, a DAC takes the binary bits of a digital input signal, which originate from a computer or other type of discrete circuitry, and converts the digital input signal into an analog output voltage that can be used to drive analog devices (e.g., motor controllers or audio circuitry).

There are several types of DACs that are well known and are capable of converting digital input signals into analog output voltages. An example of a commonly used DAC is the binary-weighted resistor DAC, which uses N binary-weighted resistors (where N is the number of bits of a digital signal to be converted). This type of DAC is logically simple to implement, however, it is typically not the most practical type of converter to use because the range of resistor values often becomes very large. In particular, accurate resistors across the range of resistor values become difficult to fabricate as the resolution of the binary-weighted resistor DAC increases (i.e., as N increases).

Another commonly used DAC is the R-2R resistor ladder DAC. The R-2R resistor ladder DAC uses an R-2R ladder to produce the currents that are inputted into a summing amplifier. Unlike the binary-weighted resistor DAC, however, the range of resistor values used in an R-2R ladder DAC is not a function of the DAC's resolution. Therefore, unlike with the binary-weighted resistor DAC, the problem of often requiring a large range of resistor values is not present. The R-2R ladder DAC, however, does not guarantee monotonicity, which may be particularly important in applications such as control systems. In other words, as the digital input signal to be converted increases in value, the analog output voltage is not guaranteed to also increase. Similarly, a decrease in the digital input signal does not guarantee a decrease in the analog output voltage of the R-2R ladder DAC.

A third type of commonly used DAC, which relates more specifically to the present invention and is explained in greater detail below, is the resistor string DAC. The resistor string DAC uses a resistor string (voltage divider) network to generate a set of analog output voltages through sequential voltage taps. Moreover, resistor string DACs use one of the simplest architectures, utilizing a string of ideally identical resistors connected in series between two reference voltages (e.g., a DAC reference voltage, Vref, and ground).

The resistor string of a resistor string DAC includes $2^N$ series connected resistors, where again, N represents the resolution of the DAC, or the number of bits in the digital input signal to be converted. Assuming identical resistors, the resistor string divides the reference voltage, Vref, into $2^N$ equally spaced voltages. The junctions (or nodes) in between each pair of connected resistors provide voltage taps through, for example, controlled switches corresponding to particular digital input signals. The respective voltage levels of these voltage taps vary according to their location relative to the reference voltages (e.g., Vref and ground).

The analog output voltage in a resistor string DAC is obtained by using one or more switches to connect the selected voltage tap to the DAC output. Persons skilled in the art will appreciate that the number of switches necessary to provide the analog output voltage depends on the type of decoder being utilized. The switches of a resistor string DAC can be controlled, for example, using an N:$2^N$ decoder that uses the binary bits of the digital signal to select one of $2^N$ available switches to be closed, allowing the desired voltage level to be passed, or transmitted, as the analog output voltage of the resistor string DAC. Other types of decoders, however, may also be used that require, for example, greater than $2^N$ switches. For example, a tree decoder may be used, in which case arranging the switches into a binary tree structure would provide inherent decoding using only the digital input signal.

Aside from simplicity in design, another major benefit associated with using resistor string DACs as opposed to other types of DACs is that resistor string DACs are intrinsically monotonic (as long as the switching elements are functioning properly). Accordingly, an increase in the digital input signal results in an increased analog output voltage, while a decrease in the digital signal results in a decreased analog output voltage.

A significant drawback associated with using resistor string DACs, however, is that the linearity of the analog output voltages corresponding to different digital input signals is limited by the precision with which the voltage division is accomplished. As the resolution of the resistor string DAC increases, the number of resistors increases exponentially, increasing the likelihood that the resistors being used will have reduced precision. Moreover, as the number of binary bits in the digital signal increases, the quantization step size decreases for any given reference voltage being used. Accordingly, the voltage taps provided by the resistor string of the resistor string DAC become much closer as the resolution of the DAC increases, thus increasing the requirements for accurately matched resistors.

Accurate resistor matching can also be a problem in another type of DAC, the interpolating amplifier DAC, which operates using the principle of a segmented DAC and is explained in greater detail below. Because interpolating amplifier DACs may also utilize resistor strings in order to provide voltage taps (for providing analog output voltages), the accuracy associated with the resistor matching in the resistor string or strings being used affects the quality (e.g., linearity) of the analog output voltages.

Due to various technological limitations, the matching of the resistor string resistors for larger resolution DACs becomes extremely difficult. One factor that limits the resistor matching, and therefore the accuracy of voltage division by the resistor string, is the introduction of error gradients (e.g., linear error gradients). Persons skilled in the art will appreciate that the phrase "error gradients" used herein may refer to a single error gradient, or a plurality of error gradients that produce deviations in resistor values as described below.

Fabrication time linear error gradients may be introduced, for example, during the resistive network fabrication process. These linear error gradients, which in some instances are the result of imperfect processing during the fabrication of resistors, may be due to a number of different factors. For example, the imperfect processing of resistors may be due in part to variations in either the doping density or fabricated resistor widths, or both. Additional factors which may lead to the introduction of linear error gradients include, for example, variations in the resistor lengths as determined by contact openings and the thickness of the resistive material layer. Accordingly, variations in the sheet resistance and geometry of the resistive materials cause imperfections during the fabrication of resistors. Moreover, variations in contact resistance may also contribute to the introduction of linear error gradients.

Linear error gradients may also be introduced at some point other than the resistive network fabrication process. For example, resistors used in resistor string DACs or interpolating amplifier DACs may be subject to thermal linear error gradients. In this case, variations in the temperature conditions surrounding the various resistors of a resistor string may result in the resistors being subject to undesirable deviations in resistor values.

In view of the foregoing, it would be desirable to provide various resistor string and interpolating amplifier DACs that are at least partially insensitive to the effects of error gradients.

SUMMARY OF THE INVENTION

It is therefore an object of the present invention to provide resistor string and interpolating amplifier DACs that are at least partially insensitive (i.e., that have at least reduced sensitivity) to error gradients such as the types of linear error gradients described above.

In accordance with this and other objects of the present invention, DAC circuitry and methods which provide digital to analog conversion with reduced sensitivity or substantial insensitivity to error gradients are provided. Split-core resistive elements are described that may be used in DAC circuitry to offset the effects of error gradients on the linearity of the available analog output voltages corresponding to various digital input signals. For example, the split-core resistive elements in accordance with the principles of the present invention include at least two resistor strings that may be configured such that a common centroid exists with respect to the error gradients. Accordingly, a plurality of resistor string output voltages may be combined in order to at least partially cancel the effects of the error gradients.

The principles of the present invention, moreover, can be applied to any suitable type of DAC, for example, a conventional resistor string DAC, segmented DAC or interpolating amplifier DAC. Examples of conventional DAC structures are Linear Technology Corp.'s LTC1257 and LTC1660 series products, which are described and claimed in commonly owned U.S. Pat. Nos. 5,396,245 and 5,859,606, and are hereby incorporated by reference herein in their entirety.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE INVENTION

This invention relates to DACs that are substantially insensitive or have at least reduced sensitivity to the effects of error gradients. More particularly, various embodiments of resistor string DACs and interpolating amplifier DACs having at least partial insensitivity to error gradients are described below in accordance with the principles of the present invention.

To better understand the detrimental effects that error gradients have on the performance of a DAC, and how the present invention compensates for such effects, conventional resistor string and interpolating amplifier DACs will first be explained.

Figure 1:
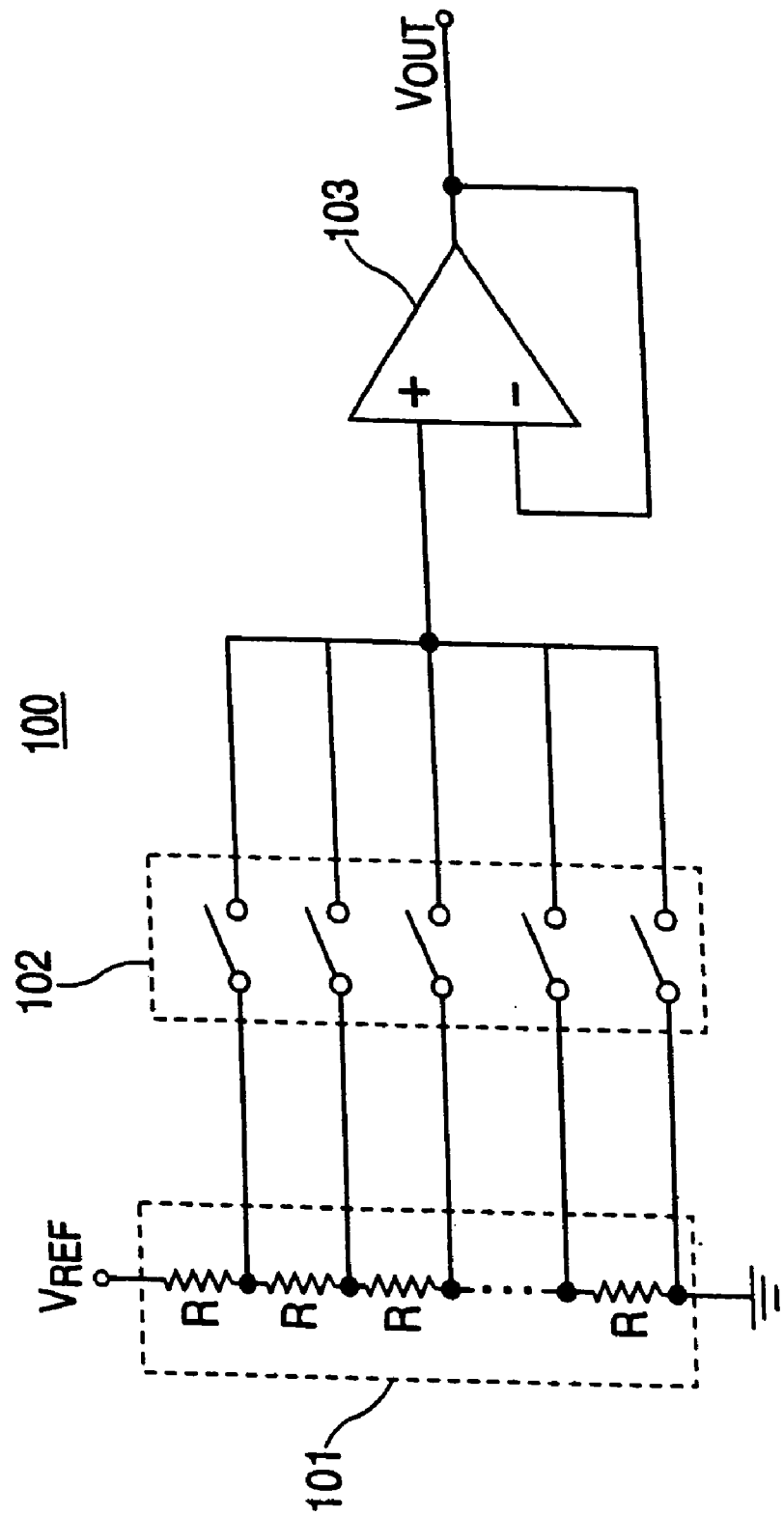
FIG. 1 is a schematic diagram of a conventional resistor string DAC.

A conventional resistor string DAC 100 that may be subject to the effects of linear error gradients is shown in FIG. 1. DAC 100 includes resistor string 101, which includes $2^N$ ideally identical resistors (e.g., each resistor of resistor string 101 has a resistance as close to R as possible). The nodes between successive series connected resistors are coupled, through switching bank 102 (which includes $2^N$ switching elements, or switches), to the input of unity gain buffer amplifier 103. Persons skilled in the art will appreciate that, as used in the specification and claims hereof, a first element may be coupled to a second element even though the elements are not linked at the same node.

FIG. 1 illustrates resistor string 101 as including conventional resistors, and switching bank 102 as including simple switching devices. These circuit components (and the comparable components discussed below in connection with the remaining figures), however, can be implemented in any suitable manner. For example, although resistors and switches are referred to herein, persons skilled in the art will appreciate that the resistors of resistor string 101 can be any suitable type of resistive material available for use in an integrated circuit, and the switches can be metal-oxide semiconductor field effect transistor (MOSFET) switches, transmission gates, or any other suitable type of circuitry. Moreover, although the figures described herein illustrate switching banks that operate using utilize $N:2^N$ decoders (not shown), persons skilled in the art will also appreciate that the invention is not limited in this manner. For example, a tree decoder together with a switching bank including more switches than found in switching bank 102 may be used without departing from the scope of the present invention. Additionally, DAC 100 can be implemented with or without the inclusion of buffer amplifier 103 as shown in FIG. 1.

When resistor string 101 consists of identical resistors, the resistors of resistor string 101 divide a reference voltage, Vref, into $2^N$ equally spaced voltages (not including Vref). Persons skilled in the art will appreciate that, instead of using ground as a voltage tap for resistor string 101, Vref may be used. Alternatively, both Vref and ground may provide voltage taps, resulting in a total of $2^N+1$ voltage taps, or neither Vref or ground may be used, resulting in $2^N-1$ voltage taps. The invention is not limited in this manner.

At any given time, only one switch in bank 102 is closed (as determined by the digital input signal to DAC 100). The digital input signal, by controlling which switch is closed, thereby determines the voltage tap from resistor string 101 that is used to provide the analog output voltage of DAC 100. For example, a digital input signal corresponding to a decimal value of 0 results in the switch nearest to ground being closed (and thus an analog output voltage of 0 volts). Conversely, an input corresponding to the highest possible decimal value (e.g., for N=4, a binary input of 1111 corresponding to a decimal value of 15) results in the switch closest to Vref being closed, and thus an analog output voltage of Vref minus the voltage drop across the top resistor (i.e., the resistor closest to Vref in FIG. 1).

As explained above, any suitable type of decoder may be used to determine the proper switch to be closed (and therefore the output of buffer amplifier 103) in response to a given digital input signal. For example, an $N:2^N$ decoder, a tree decoder or any other suitable type of decoder may be used in DAC 100 or the other DACs described herein.

Moreover, persons skilled in the art will appreciate that, in many situations, DAC 100 may have an available reference voltage Vref that is undesirably high. To reduce reference voltage Vref to a more desirable reference voltage level DACREF, a divide down resistive element may be placed between Vref and the top resistor in resistor string 101. The divide down resistive element may include, for example, a single divide down resistor. Alternatively, for improved accuracy in producing a desired divide down ratio (e.g., the ratio of DACREF to Vref), the divide down resistive element may include a series connected string of resistors.

Figure 2:
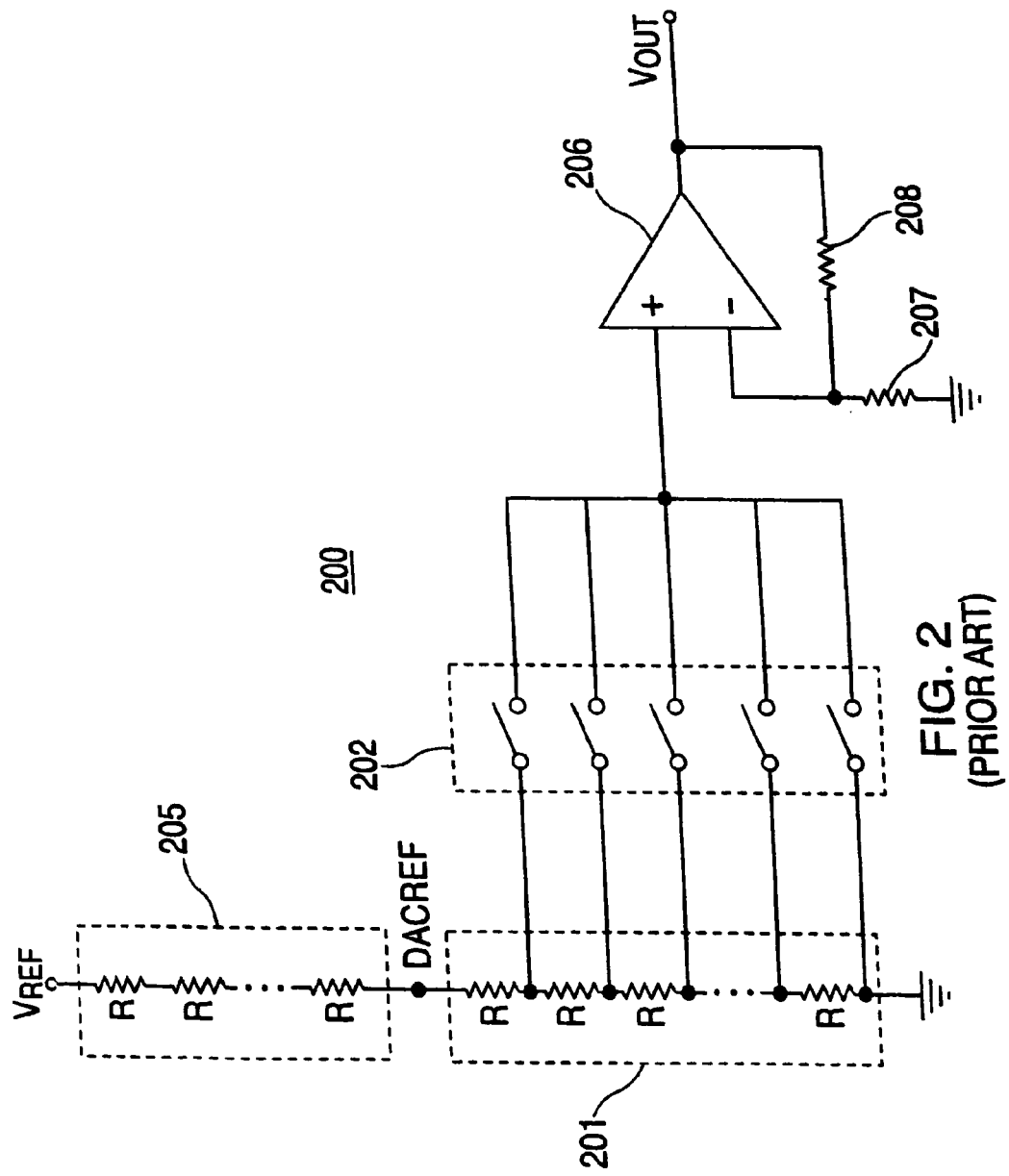
FIG. 2 is a schematic diagram of another conventional resistor string DAC that uses a divide down resistive element to allow selection of the DAC reference voltage.

FIG. 2 shows a conventional resistor string DAC 200 that reduces Vref to a desired voltage level with the use of a divide down resistive element 205, and similar to DAC 100, may be subject to the effects of error gradients. Ideally, each of the resistors in divide down resistive element 205 shown in FIG. 2 have a resistance identical to the resistors in resistor string 201, which as with the resistors in DAC 100, may be any suitable resistor value. The effect of including divide down resistive element 205 is that, assuming accurately matched resistors, the reference voltage for resistor string 201, DACREF, is reduced to a value of Vref multiplied by $2^N/(2^N+X)$ (as calculated by using simple voltage division analysis, where X is the number of resistors in divide down resistive element 205). Moreover, although a single resistor may be used in divide down resistive element 205 as described above, using a plurality of resistors substantially identical to the resistors of resistor string 201 enables more accurate ratio matching and therefore a more accurate selection of the divide down ratio between Vref and DACREF.

In addition to the inclusion of divide down resistive element 205, DAC 200 also differs from DAC 100 because, instead of providing the DAC output through the use of a buffer amplifier (e.g., buffer amplifier 103 shown in FIG. 1), DAC 200 uses non-inverting amplifier 206 and feedback resistors R1 207 and R2 208 to provide an analog output voltage. In this manner, the analog output voltage of DAC 200 for a given digital input signal can be varied by adjusting the values of resistors R1 207 and R2 208. Namely, the analog output voltage of amplifier 206 will have a value equal to the analog input voltage of amplifier 206 (which depends on the digital input signal) multiplied by (1+(R2/R1)).

A conventional interpolating amplifier DAC 300 that may also be subject to the effects of error gradients, such as linear error gradients as described above, is shown in FIG. 3. Interpolating amplifier DAC 300, when compared to DACs 100 or 200, has a significantly reduced number of required resistors and switches. Moreover, like resistor string DACs 100 and 200, DAC 300 has the benefit of guaranteed monotonicity regardless of errors associated with the voltage taps of resistor string 301.

Figure 3:
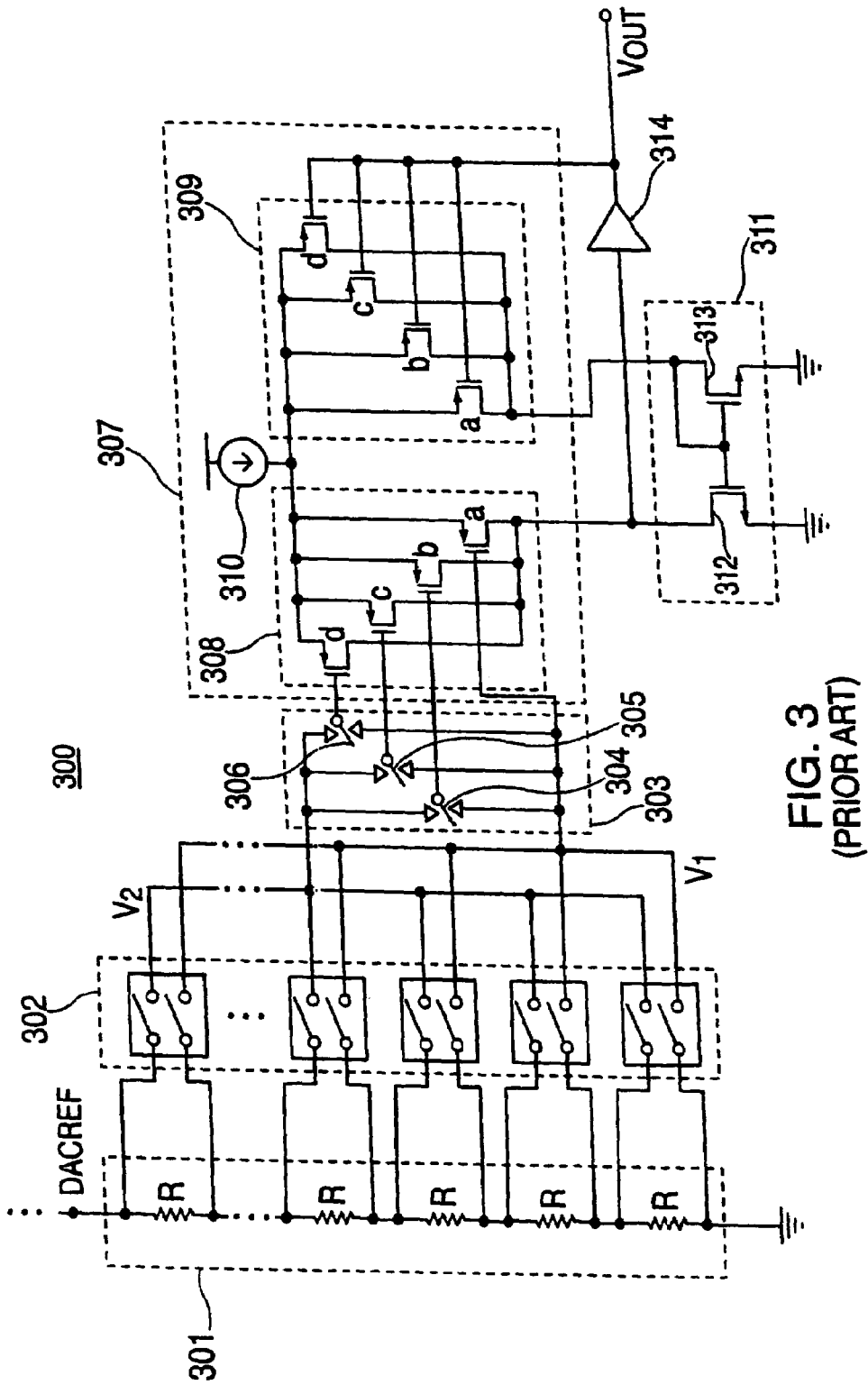
FIG. 3 is a schematic diagram of a conventional interpolating amplifier DAC.

Interpolating amplifier DACs, such as DAC 300 shown in FIG. 3, operate using the principle of a segmented DAC. The digital input signal being used to produce an analog output voltage is split into two subwords, a most significant (MS) digital subword and a least significant (LS) digital subword. Through the use of a circuit such as shown in FIG. 3, it becomes possible to produce analog output voltages corresponding not only to the voltage levels obtained from the voltage division taking place in the resistor string, but intermediate voltage levels as well.

The LS digital subword for the interpolating amplifier DAC shown in FIG. 3 has a length, L, equal to 2. This length has been chosen for the purpose of simplifying the description of DAC 300, although DAC 300 can be implemented with any value of L as well as any value of M, the length of the MS digital subword.

Moreover, in additional to resistor string 301, DAC 300 includes switching banks 302 and 303, and a single differential transconductance stage (DTS) 307, which is made up of composite PMOS transistors 308 and 309. Current source 310 feeds the source terminals of transistors 308 and 309, whose drains are respectively coupled to the drains of NMOS transistors 312 and 313, which constitute current mirror 311. The drain of transistor 312 is also coupled to the input of high-gain inverting amplifier 314, the output of which supplies the analog output voltage and is fed back to the subtransistor gates of composite transistor 309.

Resistor string 301 and switching device bank 302 are arranged in FIG. 3 to provide a pair of voltage taps for any given digital input signal. Switching bank 302 is controlled by the MS digital subword to provide output voltages $V_1=k_{m*}DACREF/2^M$ and $V_2=(k_M+1)*DACREF/2^M$, where $k_M$ refers to the decimal equivalent of the MS digital subword. Persons skilled in the art will appreciate that, in accordance with the principles of the present invention, any suitable type of decoding may be used to determine the proper pair of switches in switching bank 302 to be closed.

To interpolate a voltage level between $V_1$ and $V_2$, switching bank 303 and DTS 307 are used. Switching bank 303 is controlled by the LS digital subword such that $k_L$ (the decimal equivalent of the LS digital subword) of switches 304, 305 and 306 of switching device 303 are switched to their alternate positions (i.e., coupled to $V_2$) and $2^L-k_L$ switching devices remain in their normal positions (i.e., coupled to $V_1$).

Assuming equal geometries for each of the subtransistors of composite transistors 308 and 309 in DTS 307, all of the sub-differential pairs in DTS 307 will have substantially equal transconductances. Namely, sub-differential pairs 308a-309a through 308d-309d will each have a transconductance equal to $\frac{1}{2}^L$ times the transconductance of the composite differential pair 308-309.

Accordingly, the MS digital subword selects the voltage taps $V_1$ and $V_2$ while the LS digital subword determines at what voltage level between $V_1$ and $V_2$ the analog output voltage of DAC 300 will be. When the LS subword is zero, all subtransistor gates of composite transistor 308 are coupled to $V_1$ and Vout is substantially equal to $V_1$. Therefore, Vout is substantially equal to $k_M$*DACREF/$2^M$. Incrementing the LS subword by one causes switching bank 303 to switch one subtransistor gate of composite transistor 308 from $V_1$ to $V_2$, leaving the remaining $2^L-1$ coupled to $V_1$. In this scenario, Vout is substantially equal to $V_1$ plus $(V_2-V_1)/2^L$. Similarly, as each subsequent sub-transistor gate is switched from $V_1$ to $V_2$, Vout will move from $V_1$ towards $V_2$ by an amount of $(V_2-V_1)/2^L$.

Once all of the subtransistor gates of composite transistor 308 are switched to $V_2$ (except for 308$a$ which does not switch to $V_2$), Vout is one increment below $V_2$. The next DAC output level ($V_2$) can be reached by setting the digital subword so that $k_L$ is zero, thereby returning all of the subtransistor gates of composite transistor 308 to their normal positions, and increasing the MS digital subword by one. In doing so, switch bank 302 moves voltage taps $V_1$ and $V_2$ up on string 301, setting the new level of $V_1$ equal to the previous level of $V_2$ and moving $V_2$ one tap higher on resistor string 301.

In the manner described above, DAC 300 provides an output voltage equal to the decimal equivalent of the digital input signal times DACREF/$2^N$. In doing so, DAC 300 provides substantially the same output levels as the aforementioned non-interpolating DAC structures, but requires exponentially fewer resistors and switches. Similar to other DACs, however, the introduction of error gradients in the resistors of resistor string 301 may cause undesirable inaccuracies.

Figure 4:
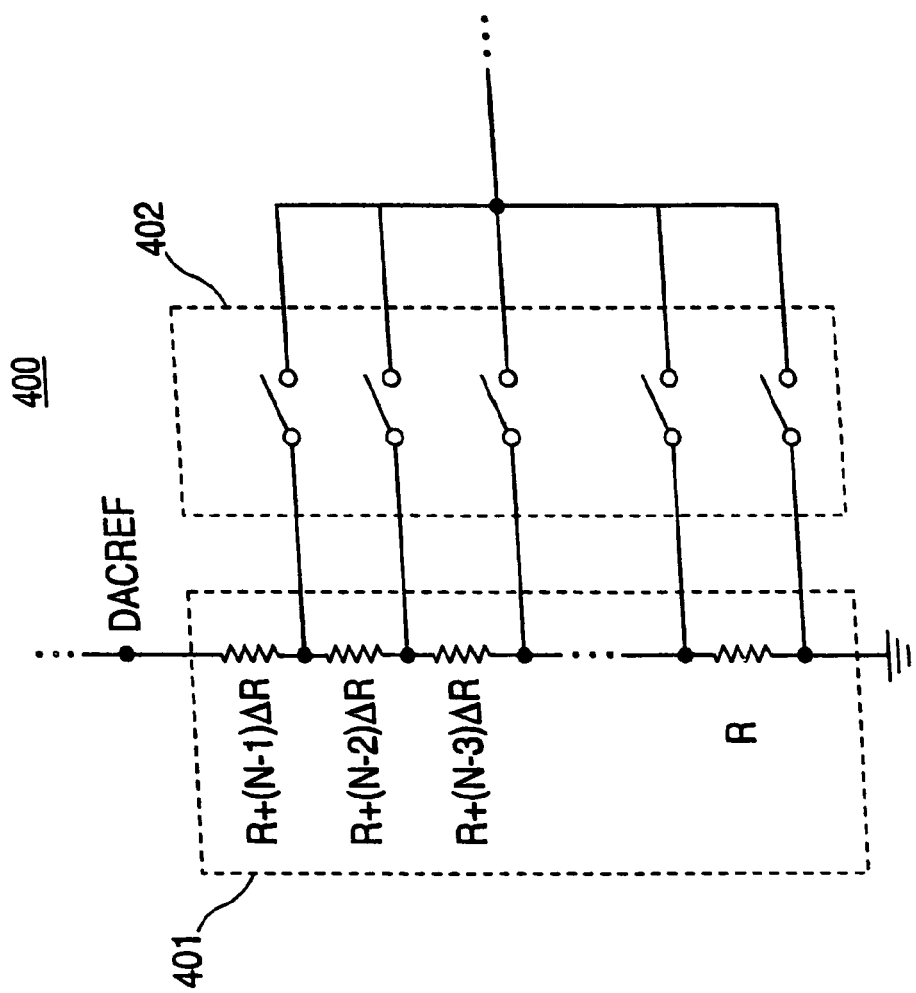
FIG. 4 is a schematic diagram of a portion of a resistor string DAC which models resistor mismatch due to the presence of linear error gradients.

Representative effects associated with error gradients are illustrated in FIG. 4. DAC 400, which shows a portion of a DAC having N resistors, includes a resistor string 401 that is affected by linear error gradients, and switching bank 402 that is similar to the switching banks described above. The result of the linear error gradients, as modeled by deviations in the resistance values of the various resistors in resistor string 401, is resistor mismatch. These linear error gradients are due to, for example, imperfect processing of integrated circuits. Moreover, while the effects of linear error gradients on resistor values is illustrated in FIG. 4, it will be appreciated by persons skilled in the art that the principles of the present invention may be applied to linear or nonlinear error gradients.

Persons skilled in the art will also appreciate that the type of resistor mismatch illustrated in FIG. 4, resulting from linear error gradients, can be present in resistor strings made up of either a one-dimensional or multi-dimensional configuration of resistors. In the case of a resistor layout that includes two-dimensional resistor strings, for example, the deviations of resistor values bears a linear relationship to the relative positioning of a given resistor with regards to both dimensional axes along which the resistors are configured. Accordingly, the deviation in the resistance value of a resistor can be expressed as a linear function of the resistor's positioning away from a center point with regards to two dimensional axes.

Consequently, a common center, or common centroid, exists about which point the effects of linear error gradients on resistor values are opposite while traversing contrary directions. In other words, repeatedly averaging the values of any two resistors equidistantly spaced apart (in opposite direction) from the common centroid with respect to the linear error gradients would result in obtaining a substantially constant resistance value. With regards to nonlinear error gradients, to which the principals of the present invention may also be applied, persons skilled in the art will appreciate that the averaging described above, while not resulting in a single resistance value as when dealing with linear error gradients, results in resistance values that are at least closer to a uniform value than without any such averaging.

Figure 5A:
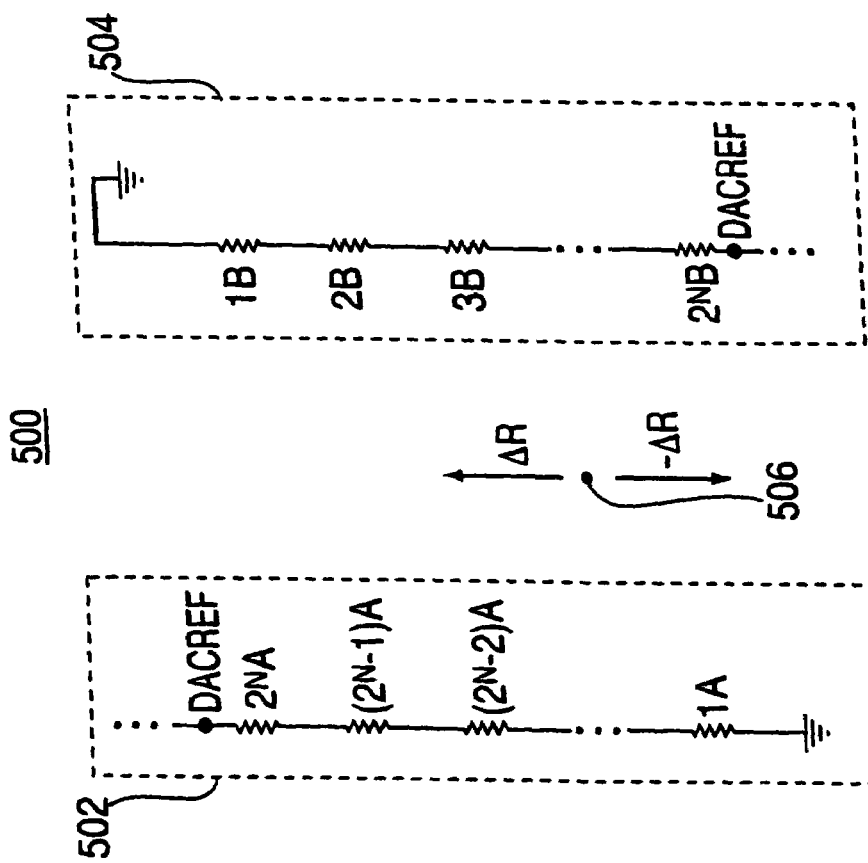
FIG. 5A is a circuit diagram of a one-dimensional resistor layout in accordance with the principles of the present invention.

FIG. 5A shows the physical arrangement of resistors on a resistor layout 500 which includes a pair of one-dimensional resistor strings 502 and 504 in accordance with the principles of the present invention. Resistor layout 500 may be used as explained below, for example, to substantially eliminate or at least reduce the effects of error gradients on the analog output voltages of a resistor string DAC. As illustrated in FIG. 5A, resistor strings 502 and 504 are configured such that corresponding resistors (e.g., resistor 1A and 1B) are spaced substantially equidistant and oppositely from common centroid 506. Therefore, combining corresponding voltage taps from resistor strings 502 and 504 (e.g., the voltages following the $i^{th}$ resistors from ground) provides an analog output voltage with minimal or substantially no effects due to linear error gradients.

Figure 5B:
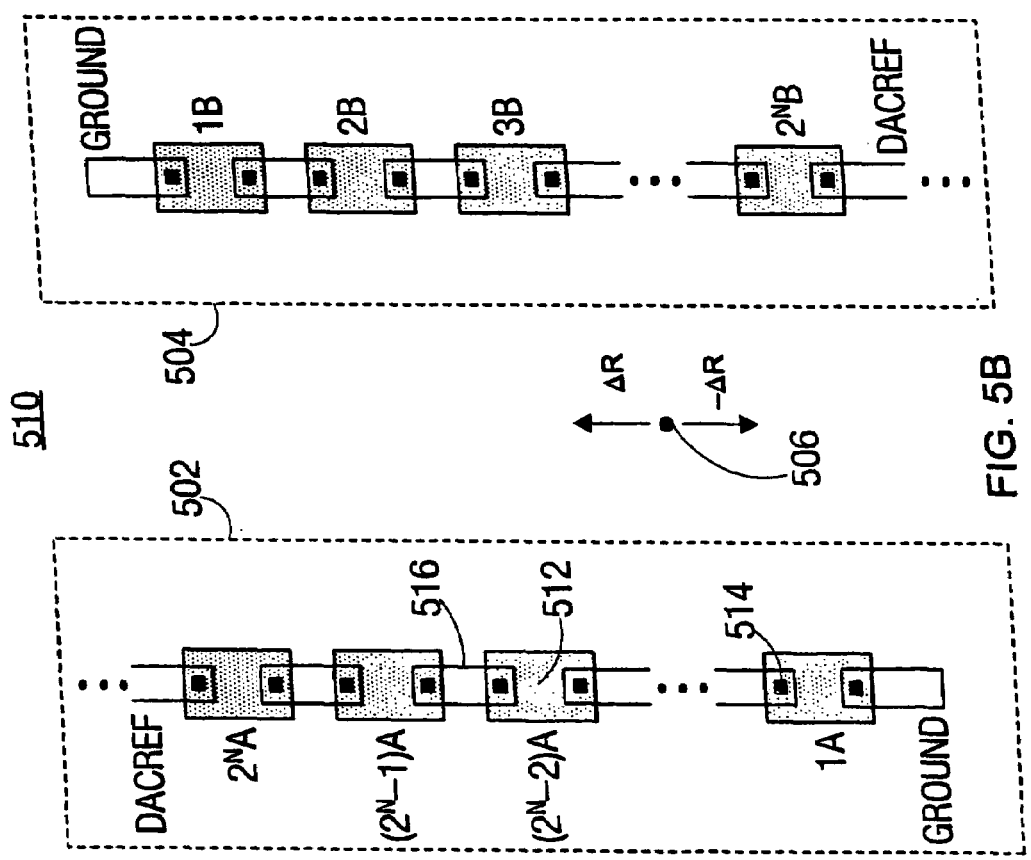
FIG. 5B is a more detailed circuit diagram of the one-dimensional resistor layout of FIG. 5A.

The resistor layout 500 of FIG. 5A is shown in more detail in FIG. 5B. As illustrated in FIG. 5B, the resistors of resistor strings 502 and 504 may be poly-silicon resistors 512. The invention, however, is not limited in this manner. Moreover, the resistor contacts 514 of each of the resistors in resistor strings 502 and 504 may be coupled by standard metal interconnects 516. Metal interconnects 516 may also be used, as illustrated in FIG. 5B, to electrically couple resistor $2^N$A of resistor string 502 and resistor $2^N$B of resistor string 504 to DACREF, and to electrically couple resistor 1A of resistor string 502 and resistor 1B of resistor string 504 to GROUND.

Figure 5C:
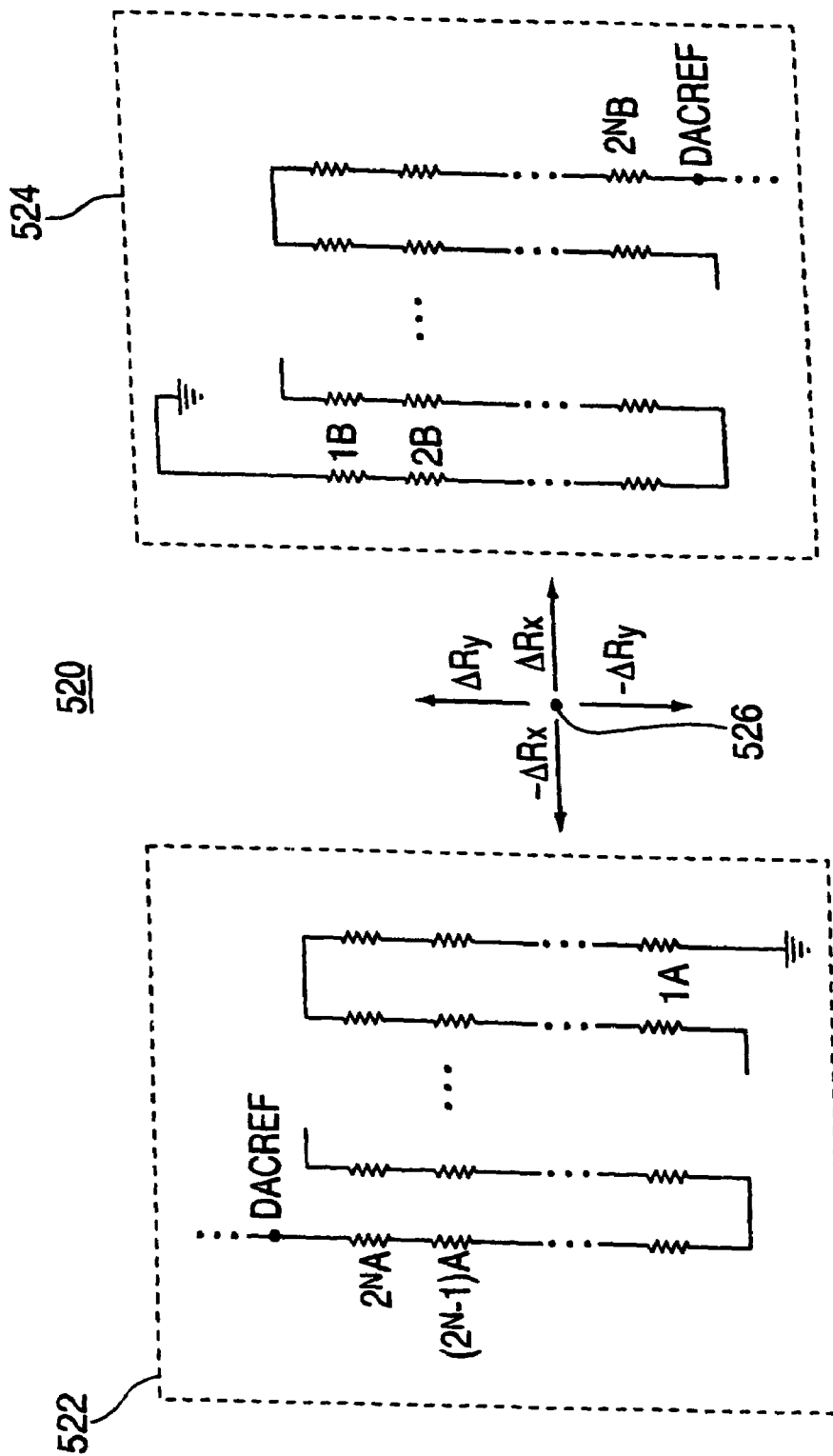
FIG. 5C is a circuit diagram of a two-dimensional resistor layout in accordance with the principles of the present invention.

FIG. 5C, meanwhile, shows another physical arrangement of resistors on a resistor layout 520 in accordance with the principles of the present invention which includes a pair of two-dimensional resistor strings 522 and 524. As with resistor layout 500, resistor layout 520 may be used, for example, to offset the effects that error gradients normally have on the available analog output voltages of resistor string DACs (e.g., as a result of deviations in resistor values due to the error gradients). For example, as illustrated in FIG. 5C, resistor strings 522 and 524 are configured such that corresponding resistors (e.g., resistors 1A and 1B) are spaced apart the same distance and in opposite directions from common centroid 526. Thus, combining corresponding voltage taps from resistor strings 522 and 524 (e.g., the voltages following the $i^{th}$ resistors from ground) provides an analog output voltage with reduced or substantially no sensitivity to the error gradients affecting resistor strings 522 and 524.

Figure 5D:
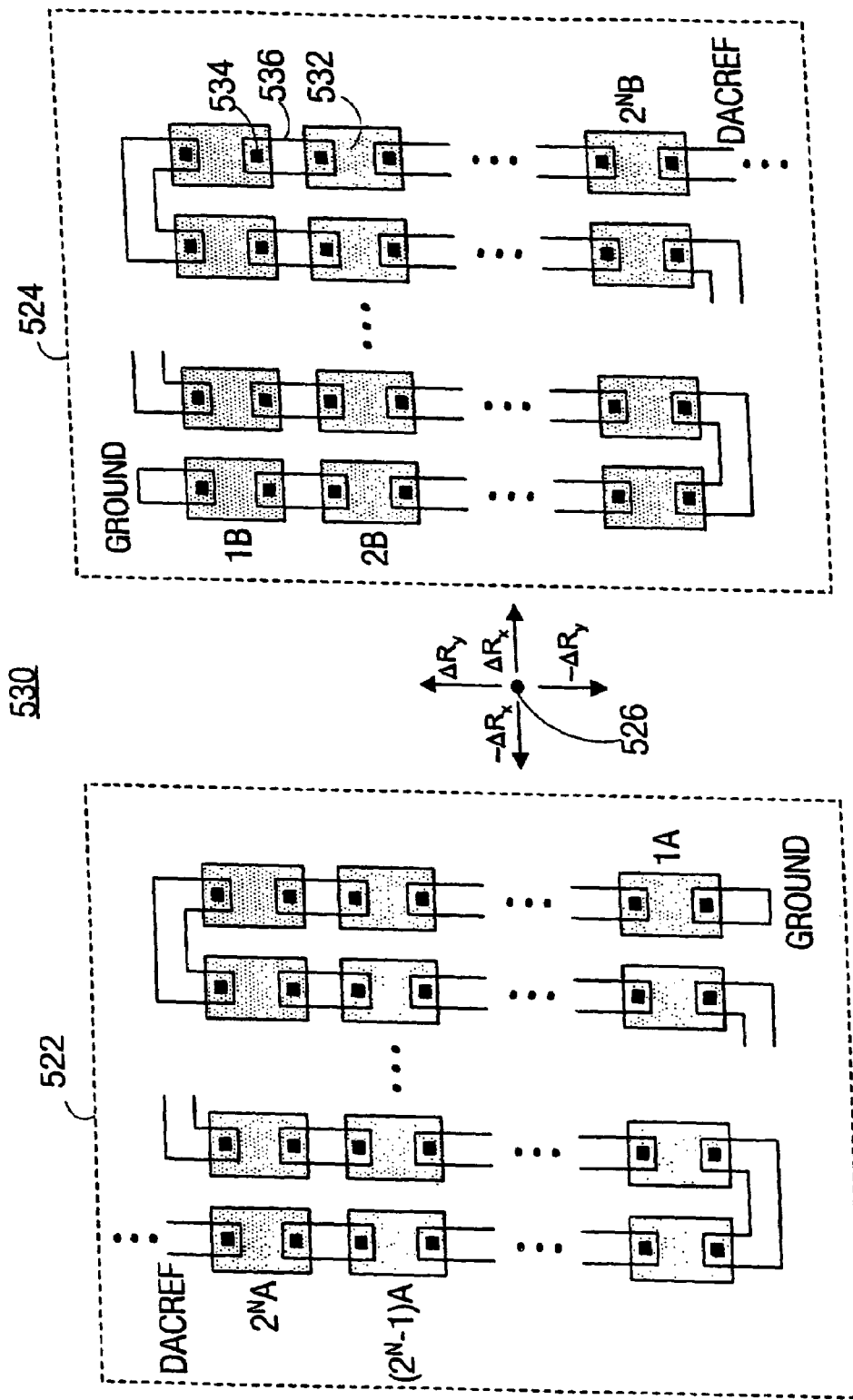
FIG. 5D is a more detailed circuit diagram of the two-dimensional resistor layout of FIG. 5C.

The resistor layout 520 of FIG. 5C is shown in more detail in FIG. 5D. As explained above in connection with resistor strings 502 and 504, the resistors of resistor strings 522 and 524 may be poly-silicon resistors 532 (although the invention is not limited in this manner). Moreover, the resistor contacts 534 of each of the resistors in resistor strings 522 and 524 may be coupled by standard metal interconnects 536. Metal interconnects 536 may also be used, for example, to electrically couple resistors $2^N$A and $2^N$B (of resistor strings 522 and 524, respectively) to DACREF, and to electrically couple resistors 1A and 1B (of resistor strings 522 and 524, respectively) to GROUND.

Persons skilled in the art will appreciate that any suitable method of row-column decoding may be used, in accordance with the principles of the present invention, with a split-core resistive element DAC (explained in detail below) using resistor layouts such as those shown in FIGS. 5A and 5C. Persons skilled in the art will also appreciate that although FIGS. 5A and 5C each show a specific layout of resistor strings that encompasses the notion of error gradient cancellation (or at least reduction of their effects), any other suitable resistor layout may be used in a split-core resistive element DAC in accordance with the principles of the present invention. For example, any resistor string layout that is configured in such a way as to contain a common centroid for the purpose of at least reducing the effects of error gradients may be used without departing from the scope of the present invention.

As will become more clear from the examples provided below, reduction or cancellation of the effects of error gradients, such as linear error gradients, using resistor layouts such as resistor layouts 500 or 520 described above is possible due to the respective configuration of resistors therein about common centroids 506 and 526 with respect to the effects of error gradients. In particular, the resistors of resistor layouts 500 and 520 are laid out in such a way that the linear error gradients, for example, cause resistors equally but oppositely spaced apart from common centroids 506 or 526 to have offsetting deviations in resistance value. Accordingly, combining the voltages following the $i^{th}$ resistor of each resistor string in either resistor layout 500 or 520, for example, results in the substantial cancellation of the effects of linear error gradients on the analog output voltage.

Persons skilled in the art will further appreciate that combining voltage taps other than those following resistors spaced exactly the same distance (and oppositely) from the common centroid, for example, may also be beneficial. In other words, combining the voltage taps following resistors 10A and 11B (not shown) in resistor layout 520 of FIG. 5C may be beneficial even if the effects of error gradients are not completely eliminated, because the effects of error gradients will at least be substantially reduced. The invention is not limited in this manner.

Figure 6:
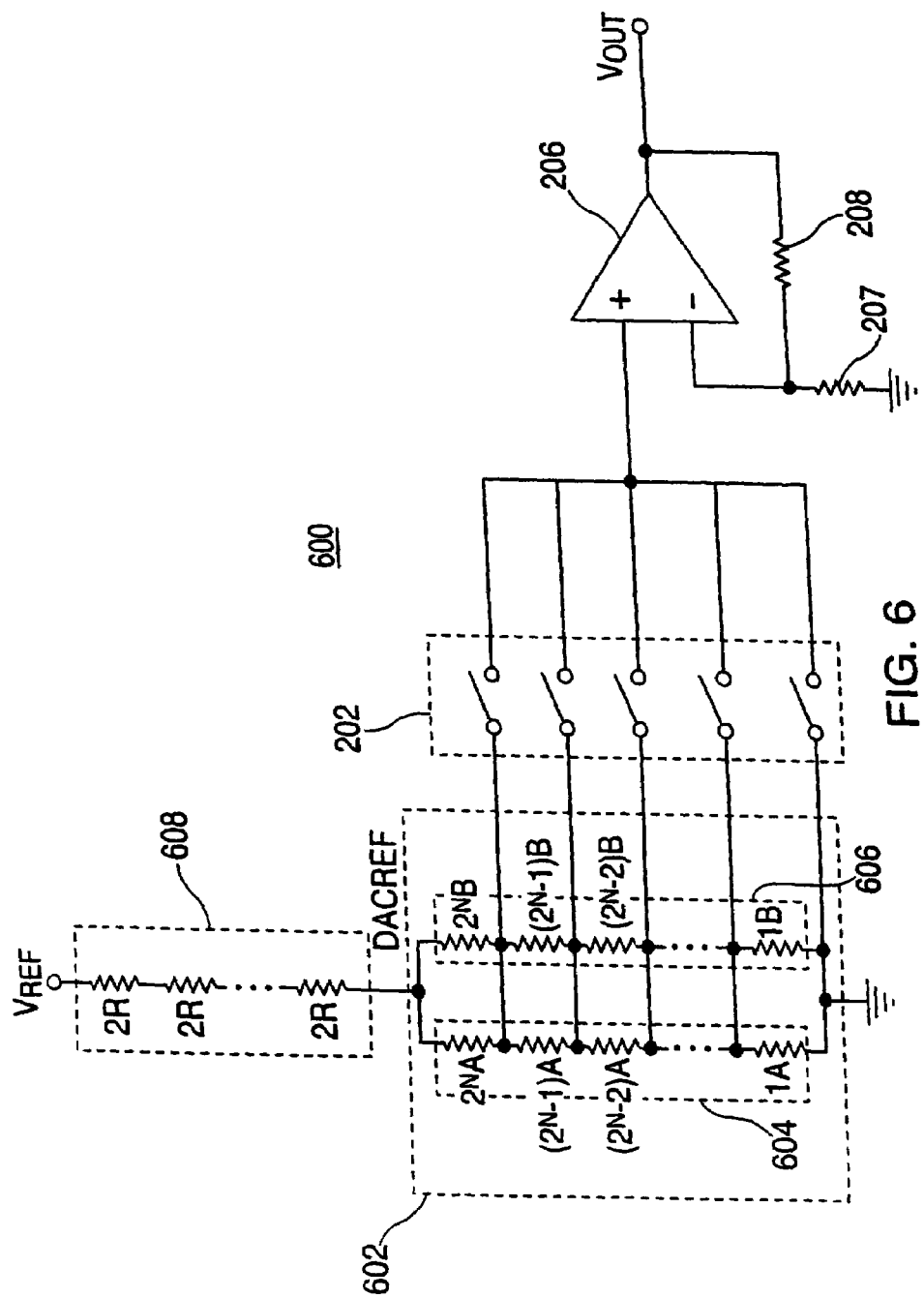
FIG. 6 is a schematic diagram of a resistor string DAC including a divide down resistive element in accordance with the principles of the present invention.

In accordance with the principles of the present invention, a resistor string DAC 600 is shown in FIG. 6 which reduces the effects of error gradients. DAC 600 is similar to DAC 200, except that DAC 600 includes a DAC resistive element 602 instead of a single resistor string 201. DAC resistive element 602, as shown in FIG. 6, includes two resistor strings 604 and 606 that are interconnected to form $2^N$ pairs of resistors connected in parallel.

In the case of linear error gradients, the resistors of DAC resistive element 602 (e.g., the resistors of resistor strings 604 and 606) are configured such that taking the average of the resistor values of the resistors connected in parallel provides a substantially constant value. This occurs when the physical layout of DAC resistive element 602 is such that the resistors of DAC resistive element 602 are substantially configured about a common centroid with respect to any linear error gradients (e.g., when the deviations in resistor values of the resistors from resistor strings 604 and 606 coupled in parallel are substantially complementary).

By coupling the resistors as illustrated in FIG. 6, the deviations in the resistive values and the effects on the analog output voltage of DAC 600 are at least partially offset. For example, assume that for DAC 600, N=2, DACREF is 4V and the resistors in resistor strings 604 and 606, in sequential order, have resistances of 1.00 kΩ, 1.01 kΩ, 1.02 kΩ and 1.03 kΩ. Lining up the resistor strings with opposite polarity (e.g., the effects of the linear error gradients being in opposite directions such as illustrated in resistor layout 500 of FIG. 5A) leads to DACREF being connected to the 1.00 kΩ resistor of resistor string 604 and the 1.04 kΩ resistor of resistor string 606. Accordingly, the parallel combinations would yield effective resistances of approximately 507.389Ω, 507.488Ω, 507.488Ω and 507.389Ω, from ground to DACREF, and sequential voltage taps of 0V, 0.9999V, 2.0000V and 3.0001V would be produced from ground up. By comparison, assuming only resistor string 604 was used, the sequential voltage taps from ground up would instead be 0V, 1.0148V, 2.0197V and 3.0148V, a much less linearized range of analog output voltages. Accordingly, persons skilled in the art will appreciate that the effects of linear error gradients on the voltage taps (and therefore the analog output voltages) is greatly reduced in DAC 600 when compared to other known DACs. Moreover, the use of DAC resistive element 602 would at least reduce the effects of nonlinear error gradients in accordance with the principles of the present invention.

Persons skilled in the art will also appreciate, moreover, that although DAC 200 shown in FIG. 2 provides a DACREF which is scaled down from Vref, divide down resistive element 205 can often consume more space than is desirable for practical applications. DAC 600, in addition to reducing the effects of linear error gradients, also uses a divide down resistive element 608 with reduced space requirements in order to reduce Vref to a more desirable reference voltage level DACREF in accordance with the principles of the present invention.

In order to reduce the size and number of resistors being used in divide down resistive element 608, which preferably uses resistors having the same resistance as the resistors of DAC resistive element 602, the resistor values of the resistors in both divide down resistive element 608 and DAC resistive element 602 may be increased. For example, DAC resistive element 602 contains $2^N$ pairs of resistors connected in parallel that have resistor values substantially double that of the resistors that were used in resistor string 201 (neglecting the effects of error gradients). The resistor values in DAC 600 can be doubled by using resistors with the same length and half the width (and therefore half the area), given that resistance is inversely proportional to the width of a given resistor. Accordingly, in addition to divide down resistive element 608 requiring only half the number of resistors compared to divide down resistive element 205 of FIG. 2 to achieve the same divide down ratio, the resistors used in DAC 600 each have half the area (taking up approximately half the space once resistor spacing is taken into consideration) compared to the resistors used in DAC 200.

Persons skilled in the art will appreciate that although 2R resistors are shown in divide down resistive element 608, the invention is not limited in this manner. For example, persons skilled in the art will appreciate that other combinations of resistors may be used to reduce either the number of resistors or the size of the resistors, or both, in divide down resistive element 205 of FIG. 2 in accordance with the principles of the present invention. For example, the resistors of DAC resistive element 602 and divide down resistive element 608 can be multiplied by a factor of four (with respect to the resistors of DAC 200) to have resistors with a value of 4R (instead of 2R as shown, and again, neglecting the effects of error gradients). Accordingly, if DAC resistive element 602 includes $2^N$ series connected resistor circuits, with each resistor circuit having four 4R resistors coupled in parallel, then divide down resistive element 608 only requires one-quarter of the number of resistors compared to divide down resistive element 205 to achieve the same desired divide down ratio. Other combinations may also be used without departing from the scope of the present invention. DAC resistive element 602 may also have, for example, resistor circuits with eight 8R (neglecting the effects of error gradients) resistors coupled in parallel. In this case, divide down resistive element 608 only requires one-eighth of the number of resistors compared to divide down resistive element 205 of FIG. 2 to achieve the same desired divide down ratio. The invention is not limited with respect to the number of resistors that are coupled in parallel in each resistor circuit of DAC resistive element 602.

The remainder of DAC 600 functions substantially similarly to that of DAC 200 shown in FIG. 2 and explained above. Depending on the digital input signal, a particular switch in switching bank 202 closes, thereby selecting the voltage tap to be transmitted to the non-inverting terminal of amplifier 206.

Furthermore, even though a non-inverting amplifier 206 and feedback resistors 207 and 208 are used in DAC 600, the invention is not limited in this manner. It should be understood by persons skilled in the art that a unity gain buffer amplifier or any other suitable type of circuitry (or no circuitry at all) may be used in place of amplifier 206 and resistors 207 and 208 without departing from the scope of the present invention.

Persons skilled in the art should also appreciate that DAC 600 may operate without divide down resistive element 608, which is optional. Moreover, the benefits of divide down resistive element 608 may be realized in any DAC such as described in accordance with the present invention, with or without the inclusion of circuitry designed to offset the effects of error gradients. The invention is not limited in this manner.

Although coupling resistors from resistor string 604 and 608 together to form the parallel connections shown in FIG. 6 DAC 600 can greatly reduce the effects of linear error gradients, often times, these effects are not completely eliminated. Moreover, the necessary wiring to make the connections may be too cumbersome and not practical in many applications.

Figure 7:
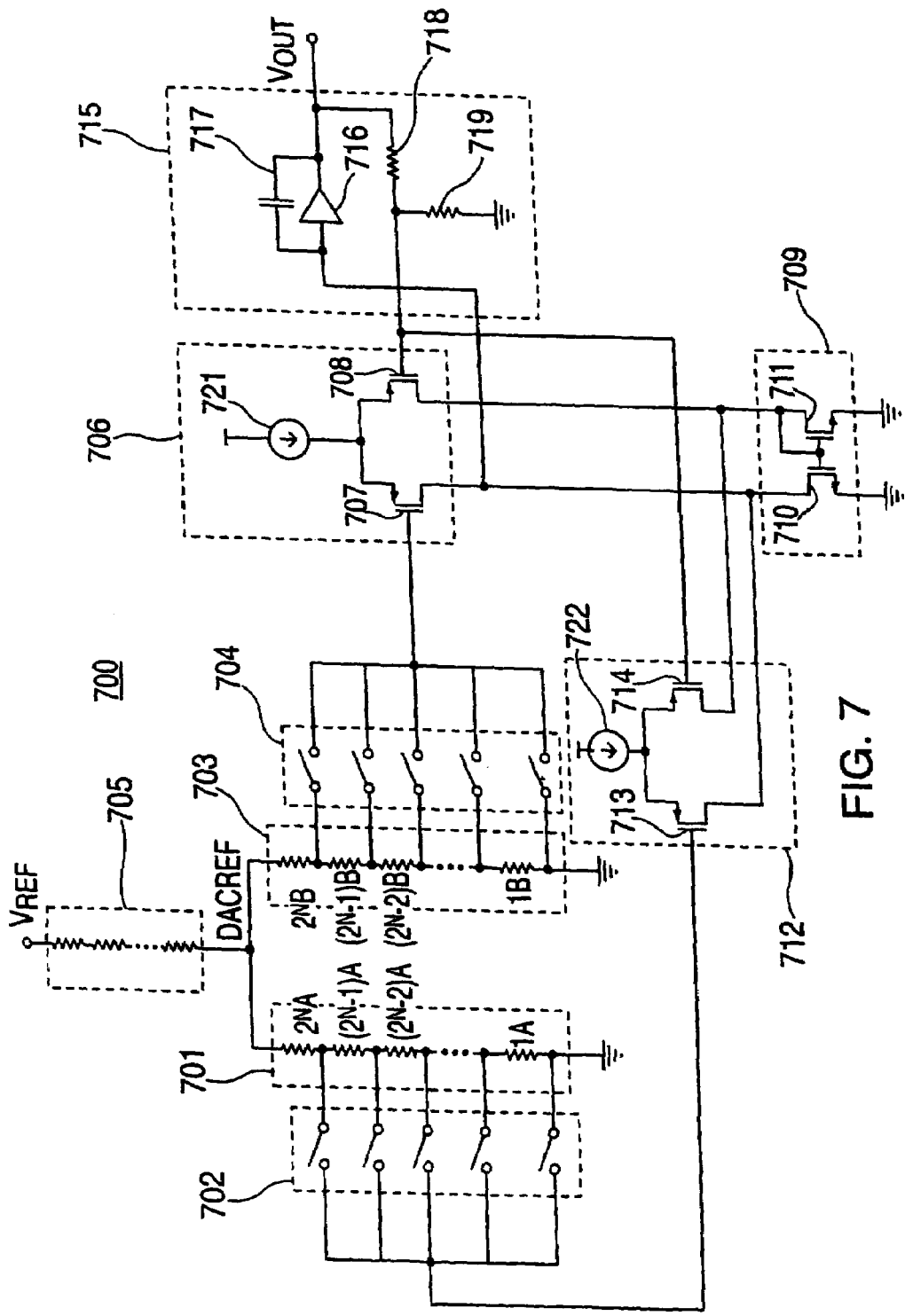
FIG. 7 is a schematic diagram of a resistor string DAC constructed to be at least partially insensitive to the effects of error gradients in accordance with the principles of the present invention.

In accordance with the principles of the present invention, a resistor string DAC 700 using a split-core resistive element (including resistor strings 701 and 703) is shown in FIG. 7 which substantially eliminates the effects of linear error gradients without requiring the formation of parallel connections such as with DAC 600.

Resistor strings 701 and 703 each consist of $2^N$ resistors, where again, N is the number of bits of the digital input signal to be converted by DAC 700. Depending on the digital input signal, corresponding switches from switching banks 702 and 704 are closed to provide one voltage tap from each of resistor strings 701 and 703. This can be accomplished using any suitable type of decoder to close the switches of switching banks 702 and 704 accordingly based on the digital input signal.

The cancellation of the effects of linear error gradients (or at least the reduction of the effects of nonlinear error gradients) on the resistor values of resistor strings 701 and 703 and on the analog output voltages of DAC 700 is possible because at least some (or each) of the resistors of resistor strings 701 and 703 may be laid out in a manner that provides a common centroid for the resistors with respect to the error gradients. Persons skilled in the art will appreciate that FIG. 7 (similar FIG. 6 described above) is a schematic diagram and that the physical layout of resistor strings 701 and 703 does not necessarily correspond to the manner in which resistors are laid out in FIG. 7. For example, resistor strings 701 and 703 may respectively be configured similar to the one-dimensional resistor strings 502 and 504 of resistor layout 500, shown in FIG. 5A, or the two-dimensional resistor strings 522 and 524 of resistor layout 520, shown in FIG. 5C.

Given the configuration of the resistors of resistor strings 701 and 703, it is possible to combine (e.g., average or add) the voltage taps from each of the resistor strings 701 and 703 in order to cancel or at least reduce the effects of error gradients. In other words, when the voltage taps from resistor strings 701 and 703 in DAC 700 are selected and averaged based on the digital input signal, the effects of the error gradients will at least partially offset each other. This results in the same output as if resistor strings with precisely matched resistors had been used. Moreover, persons skilled in the art will appreciate that, although circuitry for averaging the voltage taps from resistor strings 701 and 703 is described below, any suitable type of circuitry capable of combining voltage taps may be used without departing from the scope of the present invention. For example, instead of averaging the two voltage taps, an addition circuit may be used that combines the two voltage taps by adding the voltages together, thereby resulting in a similar reduction or cancellation of the effects of error gradients. Alternatively, combining voltage taps may simply include, as illustrated in FIG. 6, coupling the voltage taps together (although this decreases the amount by which the effects of error gradients may be reduced). The invention is not limited in this manner.

As an example of the manner in which the linear error gradients are cancelled, assume for DAC 700 that N=2 and DACREF is 4V. Moreover, assume that the four resistors from DACREF to ground in resistor string 701 have respective resistances of 0.85 kΩ, 0.95 kΩ, 1.05 kΩ and 1.15 kΩ, while the four resistors from DACREF to ground in resistor string 703 have respective resistances of 1.15 kΩ, 1.05 kΩ, 0.95 kΩ and 0.85 kΩ. This situation could occur, for example, if the top two resistors of resistor strings 701 and 703 are lined up next to each other at equal distances above the common centroid of the linear error gradients, while the bottom two resistors of resistor strings 701 and 703 are lined up next to each other at equal distances below the common centroid of the linear error gradients.

Given the values above, the sequential voltage tap values for resistor string 701, from ground up, would be 0V, 1.15V, 2.2V and 3.15V (using voltage division), and 0V, 0.85V, 1.80V and 2.85V, from ground up, for resistor string 703. Thus, by averaging the respective voltage taps corresponding to the various digital input signals, a substantially linearized step-up in the voltage level from ground to Vref results. For example, given the above values, the available averaged outputs are 0V at ground, followed by 1V, 2V and 3V beginning with the voltage tap above ground. In this manner, DAC 700 would be substantially insensitive to any linear error gradients that are present (e.g., the analog output voltages of DAC 700 increase substantially linearly as the digital input signal is increased).

Persons skilled in the art will appreciate that the above described configurations of resistors with respect to error gradients is only representative of the manner in which the effects of error gradients may be reduced or eliminated in a resistor string DAC in accordance with the principles of the present invention. For example, resistor strings 701 and 703 may be configured such that all of the resistors of resistor string 701 are located above the common centroid, while all of the resistors of resistor string 703 are located below the common centroid. In this case, for example, the resistors of resistor string 701 may have values of 0.85 kΩ, 0.95 kΩ, 1.05 kΩ and 1.15 kΩ. Meanwhile, the deviation in resistor values of resistor string 703 may continue such that the resistors of resistor string 703 have values of 1.25 kΩ, 1.35 kΩ, 1.45 kΩ and 1.55 kΩ. Lining up the resistors such that the 1.15 kΩ resistor end of resistor string 701 and the 1.25 kΩ resistor end of resistor string 703 are connected to DACREF (e.g., 4V), while the other ends of resistor strings 701 and 703 are connected to ground, the voltage taps from resistor strings 701 and 703 can be averaged to produce analog output voltages of 0V, 0.9785V, 1.9715V and 2.9785V from ground up. Compared to the analog output voltages that result from using only resistor string 701 (0V, 0.85V, 1.8V and 2.85V from ground up), it is clear that the effects of error gradients are greatly reduced. The invention is not limited in this respect. Moreover, it should be understood that while the provided deviations in resistor values due to error gradients are relatively extreme in the examples above for DAC 700, the principles of the present invention may be utilized by substantially any resistor string DAC to enhance the linearity of its analog output voltage, regardless of whether such deviations are relatively small or large.

To accomplish the averaging described above, DAC 700 uses an averaging circuit that includes first differential transconductance stage (DTS) 706 and second differential transconductance stage (DTS) 712. DAC 700 also includes current mirror 709 and amplifier gain circuitry 715, which includes amplifier 716, capacitor 717 and resistors 718 and 719.

The output of switching bank 704 is coupled to the input of DTS 706, which includes current source 721 and transistors 707 and 708. The drains of transistors 707 and 708 form first and second differential current outputs of DTS 706, respectively. The difference between the currents flowing from the drains of transistors 707 and 708 create a differential current generated by DTS 706.

The second input of DTS 706 is coupled to Vout (the output of amplifier 716) through feedback resistor 718. In the absence of DTS 712, the negative feedback path, including resistors 718 and 719, would ensure that the currents flowing out of the drains of transistors 707 and 708 are substantially equal. This, in turn, would ensure that the gate voltages of transistors 707 and 708 are substantially equal.

Meanwhile, as illustrated in FIG. 7, the output of switching bank 702 is coupled to the input of DTS 712, which includes current source 722 and transistors 713 and 714. The second input of DTS 712 is coupled to the second input of DTS 706.

The drains of the transistors 713 and 714 form respective first and second differential current outputs of DTS 712 (much like transistors 707 and 708 of DTS 706). Moreover, the difference between the currents flowing from the drains of transistors 713 and 714 create the differential current generated by DTS 712.

When equal currents flow out of the drains of transistors 713 and 714, the output Vout is substantially unaffected by the presence of components 713, 714 and 722, due to the action of current mirror 709 (made up of transistors 710 and 711). This equal current will flow when the gates of transistors 713 and 714 are at equal voltages, and because the gate of transistor 714 is coupled to the gate of transistor 708, this will occur when the output of switching bank 702 matches the output of switching bank 704. Given the effect of linear error gradients, however, the respective voltages at the gates of transistors 707 and 713 will likely not be matched, and therefore, current mirror 709 will cause an averaging of these voltages to appear at Vout (adjusted by resistors 718 and 719).

The inclusion of DTS 712 causes the voltage at the gates of transistors 708 and 714 to be halfway between the voltage outputs of switching banks 702 and 704. This is because the voltage output at the gates of transistors 708 and 714 will swing until the currents into the current mirror 709 are equal, which happens when the sum of the two differential currents from DTS 712 and DTS 706 is zero (e.g., the differential current from DTS 706 is equal and opposite to the differential current from DTS 712). This occurs when the differential voltages in the respective transistors of DTS 706 and 712 are equal and opposite. For example, if the gate voltage of transistor 707 is higher then the gate voltage of transistor 708 by 5 mV, then the gate voltage of transistor 713 is less than the gate voltage of transistor 714 by 5 mV. This is what happens, for example, if the output from switching bank 704 is 10 mV higher than output from switching bank 702. In this manner, the common gate of transistors 708 and 714 will always be adjusted to be halfway between the output voltages from switching bank 704 and switching bank 702.

Persons skilled in the art will appreciate that achieving the type of averaging described above depends on DTS 706 and 712 having substantially equal transconductance (Gm) values because the Gm values determine the necessary magnitude of differential voltages required to generate a given differential current. For this reason, the Gm values should be as close as possible if precise averaging is desired. The invention, however, is not limited in this manner. For example, DTS 706 and 712 may have GM values that are not identical if exact averaging is not desired.

Persons skilled in the art will also appreciate that any other type of suitable circuitry capable of combining voltage taps from resistor strings 701 and 703 (e.g., averaging the selected voltage taps from resistor strings 701 and 703) may be used without departing from the scope of the present invention. Alternatively, as explained above, circuitry may be used in accordance with the principles of the present invention that, instead of averaging, adds the voltage taps from resistor strings 701 and 703 together to provide the analog output voltages. In this case, DACREF may be reduced by a factor of two in order to produce substantially the same output as if averaging of the voltage taps was done. Alternatively, instead of reducing DACREF, the analog voltage output can be reduced through voltage division (or any other suitable manner of attenuation) to a more desirable level. Moreover, although divide down resistive element 705 can be used to manipulate Vref in order to produce any desired value for DACREF, divide down resistive element 705 can also be eliminated from the circuit altogether if unnecessary. The invention is not limited in this manner.

Figure 8:
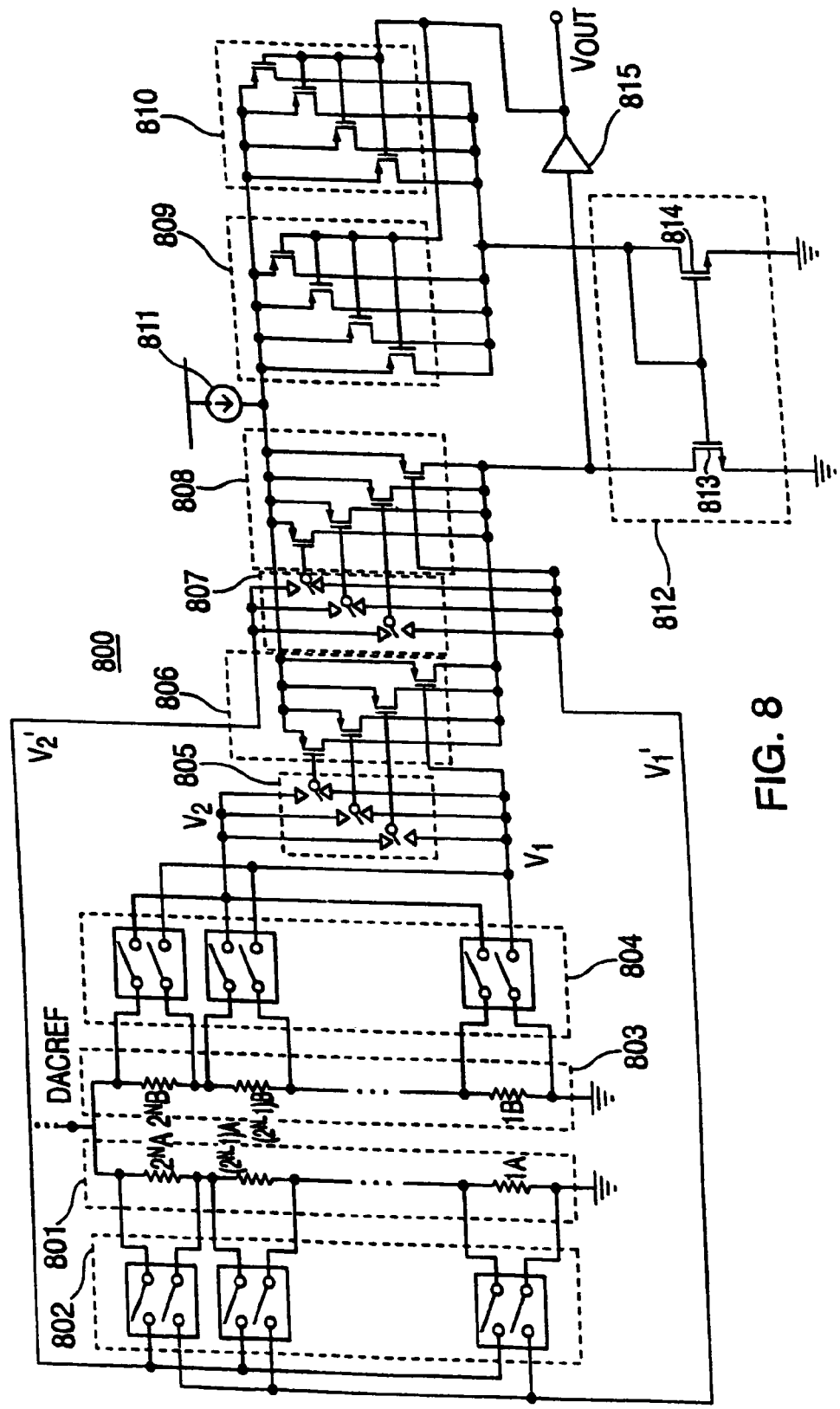
FIG. 8 is a schematic diagram of an interpolating amplifier DAC constructed to be at least partially insensitive to the effects of error gradients in accordance with the principles of the present invention.

In addition to the resistor string DACs described above, the principles of the present invention can also be applied to interpolating amplifier DACs. FIG. 8 shows an embodiment of a gradient insensitive interpolating amplifier DAC using a split-core resistive element that includes resistor strings 801 and 803 in accordance with the principles of the present invention. Persons skilled in the art will appreciate that the layout of resistor strings 801 and 803 may be similar to that of resistor layouts 500 or 520 in accordance with the principles of the present invention. The invention is not, however, limited to the specific resistor layouts described herein Using the same error averaging concept as presented in connection with DAC 700 of FIG. 7, the circuit of FIG. 8 utilizes the common centroid of the error gradients affecting the resistors in the split-core resistive element to cancel the effects of the error gradients. As explained above for the DAC 700 shown in FIG. 7, the resistors of resistor strings 801 and 803 are laid out in such a manner, for example, that a common centroid exists with respect to any error gradients that affect DAC 700. Accordingly, it becomes possible to combine (e.g., average or add) the voltage taps transmitted from resistor strings 801 and 803 in order to at least partially cancel the effects of the error gradients.

DAC 800 of FIG. 8 operates by using two substantially identical interpolators interconnected as shown to form a single interpolation circuit that interpolates between two separate pairs of voltage taps from resistor strings 801 and 803. The first of the two interconnected interpolators includes switching device bank 805 and composite PMOS transistors 806 and 809, while the second includes switching device bank 807 and composite PMOS transistors 808 and 810. Switching device banks 802 and 804 use the MS digital subword to select the respective pairs of voltage taps, while switching device banks 805, and 807 use the LS digital subword to properly produce the desired interpolated analog voltage signal.

Current source 811 feeds the sources of composite transistors 806 and 808, and composite transistors 809 and 810, whose drains are respectively coupled to the drains of NMOS transistors 813 and 814 (which constitute current mirror 812). The drain of transistor 813 is coupled to the input of high-gain, inverting amplifier 815, the output of which supplies the analog output voltage and is fed back to the subtransistor gates of composite transistors 809 and 810.

Interpolating amplifier DAC 800 selects two pairs of voltage taps (V1, V2 and V1', V2') based on the MS digital subword. The LS digital subword, meanwhile, produces an output voltage level between the average of the voltage tap levels (e.g., between (V1+V1')/2 and (V2+V2')/2). For example, if all of the switches in switching device banks 805 and 807 are in their normal positions (when the LS digital subword is zero), then each of the subtransistors of composite PMOS transistor 806 are switched to V1, while each of the subtransistors of composite PMOS transistor 808 are switched to V1'. When this occurs, the output voltage is halfway between V1 and V1' (i.e., the average of V1 and V1'). As the LS digital subword is increased, kL (the decimal equivalent of the LS digital subword) subtransistors in composite transistors 806 and 808 are switched to V2 and V2', respectively. In this manner, the interpolated voltage increases in even steps toward a value halfway between V2 and V2'.

Persons skilled in the art will appreciate that although an interpolation circuit (consisting of two identical interpolators) is shown in FIG. 8 that interpolates between two separate pairs of voltage taps, using current mirror 812 and amplifier 815, the invention is not limited in this manner. For example, two independent interpolators may be used to respectively interpolate between a pair of voltage taps from resistor string 801 and a pair of voltage taps from resistor string 803, in which case additional circuitry (such as shown in FIG. 7) may be used to combine the two resulting interpolated voltage levels to produce the analog output signal of DAC 800. Moreover, persons skilled in the art will also appreciate that, as explained above, DACREF can be varied by using, for example, a divide down resistive element. Alternatively, voltage division can be introduced at the amplifier output in order to adjust the analog output level range as desired.

Figure 9:
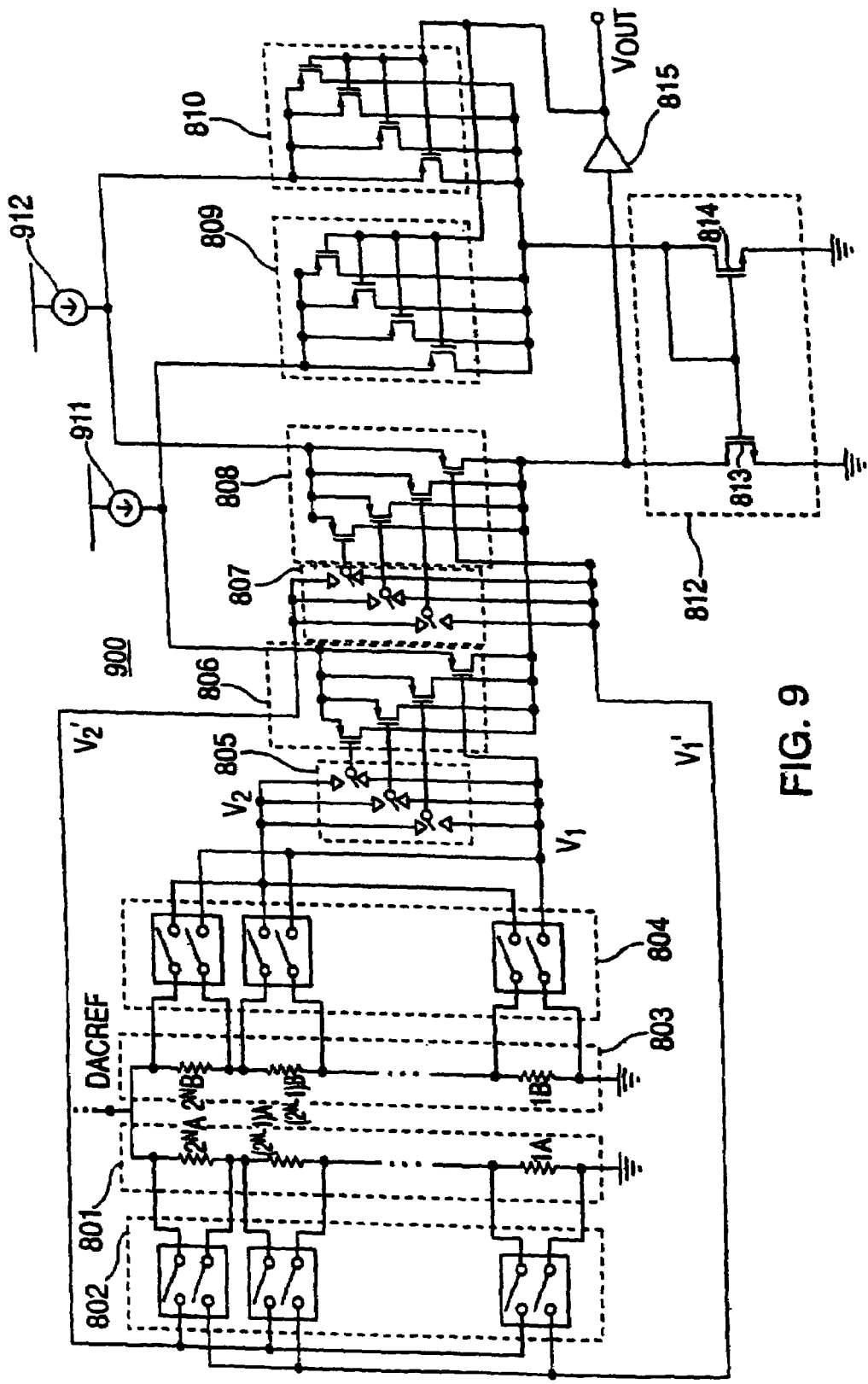
FIG. 9 is a schematic diagram of another interpolating amplifier DAC constructed to be at least partially insensitive to the effects of error gradients in accordance with the principles of the present invention.

FIG. 9 shows a preferred embodiment of an interpolating amplifier DAC using a split-core resistive element that is substantially insensitive to error gradients. DAC 900 is substantially similarly to DAC 800 of FIG. 8, except that DAC 900 uses a split current source (current sources 911 and 912) instead of using a single current source 811 as shown in FIG. 8. These current sources feed the sources of composite transistors pairs 806-809 and 808-810. By using two current sources 911 and 912 as shown, the differential nonlinearity (DNL) of DAC 900 may be substantially reduced with only minor modifications when compared to DAC 800 of FIG. 8, where the DNL is a measure of the worst case deviation from the 1 least significant bit (LSB) step in the analog output voltage of DAC 900.

Persons skilled in the art will appreciate that, for example, a divide down resistive element may be included in DAC 800 or DAC 900 without departing from the scope of the present invention, and that the present invention is not limited by the specific configurations described herein. For example, although a non-unity gain amplifier 306 with feedback resistors 307 and 308 is shown in FIG. 3 but not in FIG. 8, the invention is not limited in this manner. Rather, any combination of the above described configurations remain within the scope of the principles of the present invention. Accordingly, for example, one or more gain or attenuation stages may be included in DAC 900 shown in FIG. 9 without departing from the scope of the present invention.

Moreover, for the purpose of simplifying the description of the invention, gradient insensitive split-core resistive element and interpolating amplifier DACs have been explained above which use two resistor strings to reduce or eliminate the effects of error gradients. Persons skilled in the art will appreciate, however, that the invention is not limited in this manner. The principles of the present invention also apply to split-core resistive element DACs that include more than two resistor strings, in which case a greater number of voltage taps than described above would be combined for the purpose of at least reducing the effects of error gradients. Using multiple resistor strings configured in any combination that would allow for the reduction or cancellation of error gradients in accordance with the principles of the present invention can be accomplished with minor modification to the DACs shown above. Moreover, although the level of insensitivity to error gradients may not be as high if the error gradients are not nonlinear, as explained above, the invention is not limited to the type of error gradients that are being compensated for.

Persons skilled in the art will also appreciate that although several of the resistive elements described herein are referred to as resistors, the embodiments of the present invention may include not only resistors but also any other suitable type or types of resistive materials without departing from the scope of the present invention. Moreover, various components described above are optional and may be eliminated without departing from the scope of the present invention. For example, divide down resistive element 705 may be removed such that resistor strings 701 and 703 are coupled directly to an available reference voltage Vref. Similarly, while FIGS. 8 and 9 both show resistor strings 801 and 803 coupled to DACREF, it should be understood by persons skilled in the art that DACs 800 and 900 may or may not use a divide down resistive element such as divide down resistive element 705 of FIG. 7. The invention is not limited in this manner.

The above described embodiments of the present invention are presented for purposes of illustration and not of limitation, and the present invention is limited only by the claims which follow.

What is claimed is:

1. A digital to analog converter that produces an analog output voltage indicative of a digital input signal, the converter comprising:
    a split-core resistive element comprising at least first and second resistive strings configured in such a pattern as to provide said analog output voltage with at least partial insensitivity to error gradients that affect said split-core resistive element;
    said split-core resistive element being coupled to a first reference voltage and a second reference voltage;
    said first and second resistive strings each having a plurality of sequential voltage taps for supplying voltages based on said digital input signal to an interpolation circuit;
    said interpolation circuit being configured for producing at least one interpolated voltage based on at least two voltages selected from the voltage taps of the first resistive string and at least two voltages selected from the voltage taps of the second resistive string to provide said analog output voltage, said interpolated voltage having at least two distinct values indicative of the digital input signal, and said interpolation circuit drawing substantially zero current from said resistive strings.

2. The converter of claim 1 wherein said interpolation circuit comprises an amplifier.

3. The converter of claim 1 wherein the pattern in which said first and second resistive strings are configured is one-dimensional.

4. The converter of claim 1 wherein the pattern in which said first and second resistive strings are configured is multi-dimensional.

5. The converter of claim 1 wherein:
said first and second resistive strings are coupled in parallel to said first and second reference voltages;
each of said first and second resistive strings comprises a plurality of resistors; and
said plurality of resistors of said first and second resistive strings are configured about a common centroid with respect to the error gradients.

6. The converter of claim 1, further comprising first and second switching banks that each comprise a plurality of switches, the first and second switching banks respectively coupled to voltage taps of said first and second resistive strings for selecting said voltages from said first and second resistive strings.

7. The converter of claim 6, further comprising at least one decoder that controls the first and second switching banks based on the digital input signal.

8. The converter of claim 7, wherein:
the digital input signal comprises a most significant digital subword and a least significant digital subword; and
said at least one decoder is configured to control the first and second switching banks based on the most significant digital subword.

9. The converter of claim 1 wherein said second reference voltage is ground.

10. A method for producing an analog output voltage indicative of a digital input signal with at least partial insensitivity to any error gradients, the method comprising:
providing a digital to analog converter (DAC) having a split-core resistive element and at least one interpolation circuit coupled to said split-core resistive element, wherein said split-core resistive element comprises at least first and second resistor strings that are configured in such a pattern as to provide the analog output voltage with at least partial insensitivity to any error gradients that affect said split-core resistive element;
dividing down a DAC reference voltage into a plurality of sequential voltage levels using each of said resistor strings;
transmitting to said interpolation circuit at least two of said plurality of sequential voltage levels from each of said resistor strings based on said digital input signal; and
interpolating signals for generating at least one interpolated voltage with at least two distinct values indicative of the digital input signal, based on at least two voltage levels from the first resistor string and at least two voltage levels from the second resistor string to provide said analog output voltage,
said interpolation circuit drawing substantially zero current from said resistor strings.

11. The method of claim 10, wherein transmitting to said interpolation circuit comprises transmitting said at least two of the plurality of sequential voltage levels from each of said resistor strings using first and second switching banks.

12. The method of claim 11, further comprising controlling the first and second switching banks based on the digital input signal.

13. The method of claim 12, wherein:
the digital input signal comprises a most significant digital subword and a least significant digital subword; and
controlling the first and second switching banks comprises controlling the first and second switching banks based on the most significant digital subword.

14. The method of claim 12, further comprising decoding the digital input signal using a decoder.

15. A circuit that produces an analog output voltage indicative of a digital input signal, the circuit comprising:
a digital to analog converter comprising a split-core resistive element and at least one interpolation circuit;
said split-core resistive element comprising a first resistive string and a second resistive string configured in such a pattern as to provide the analog output voltage with at least partial insensitivity to error gradients that affect the first resistive string and the second resistive string, the first resistive string dividing a voltage range into a first set of voltage taps and the second resistive string dividing the voltage range into a second set of voltage taps, wherein the voltage range spans a first reference voltage and a second reference voltage; and
said at least one interpolation circuit being configured for generating at least one interpolated voltage based on at least two voltages selected from the first set of voltage taps and at least two voltages selected from the second set of voltage taps, wherein the voltages selected from said first and second sets of voltage taps are selected based on the digital input signal, and wherein the analog output voltage is a function of said at least one interpolated voltage,
said at least one interpolation circuit being further configured for producing at least two distinct values indicative of the digital input signal, and drawing substantially zero current from said resistive strings.

16. The circuit of claim 15, further comprising at least first and second switching banks that respectively couple the first and second sets of voltage taps to said at least one interpolation circuit, wherein the first and second switching banks are controlled by the digital input signal.

17. The circuit of claim 16, further comprising a decoder that controls the first and second switching banks based on the digital input signal.

18. The circuit of claim 16, wherein the first resistive string and the second resistive string are configured about a common centroid with respect to the error gradients.

19. The circuit of claim 15, wherein:
the first resistive string and the second resistive string each comprises a plurality of resistors; and
the pattern in which the first resistive string and the second resistive string are configured is one-dimensional.

20. The circuit of claim 15, wherein:
the first resistive string and the second resistive string each comprises a plurality of resistors; and
the pattern in which the first resistive string and the second resistive string are configured is multi-dimensional.

* * * * *